(12) United States Patent
Kim et al.

(10) Patent No.: US 11,751,418 B2
(45) Date of Patent: Sep. 5, 2023

(54) DISPLAY DEVICE AND METHOD OF FABRICATING THE SAME

(71) Applicant: SAMSUNG DISPLAY CO., LTD., Yongin-si (KR)

(72) Inventors: Seung Kim, Seongnam-si (KR); Junehyoung Park, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 37 days.

(21) Appl. No.: 17/453,374

(22) Filed: Nov. 3, 2021

(65) Prior Publication Data

US 2022/0059797 A1 Feb. 24, 2022

Related U.S. Application Data

(62) Division of application No. 16/672,953, filed on Nov. 4, 2019, now Pat. No. 11,196,019.

(30) Foreign Application Priority Data

Nov. 5, 2018 (KR) .......................... 10-2018-0134605

(51) Int. Cl.
*H01L 51/52* (2006.01)
*H10K 50/842* (2023.01)
(Continued)

(52) U.S. Cl.
CPC ....... *H10K 50/8426* (2023.02); *H10K 59/122* (2023.02); *H10K 71/00* (2023.02);
(Continued)

(58) Field of Classification Search
CPC . H01L 51/5246; H01L 27/3246; H01L 51/56; H01L 51/525; H01L 23/564;
(Continued)

(56) References Cited

U.S. PATENT DOCUMENTS 4,973,564 A * 11/1990 Chyung .................... C03C 8/24
428/312.6
7,431,628 B2 * 10/2008 Park .................... H10K 50/8426
445/44

(Continued)

FOREIGN PATENT DOCUMENTS

EP 1814186 8/2007
JP 2011-018479 1/2011
(Continued)

OTHER PUBLICATIONS

European Search Report dated Apr. 3, 2020 in corresponding European Patent Application No. 19207083.7 (6 pages).

*Primary Examiner* — Jarrett J Stark
(74) *Attorney, Agent, or Firm* — F. CHAU & ASSOCIATES, LLC

(57) ABSTRACT

A display panel may include a first display substrate, a second display substrate disposed over the first display substrate, and a sealing member bonding the first display substrate and the second display substrate. The sealing member may include a frit sealing member including an outer region and an inner region, with the inner region disposed next to an inner side of the outer region and having a first crystallization temperature lower than a second crystallization temperature of the outer region, and an organic sealing member disposed next to an inner side of the frit sealing member.

11 Claims, 24 Drawing Sheets

(51) Int. Cl.
  *H10K 59/122* (2023.01)
  *H10K 71/00* (2023.01)
  *H01L 23/00* (2006.01)
  *H10K 50/84* (2023.01)

(52) U.S. Cl.
  CPC .......... *H01L 23/564* (2013.01); *H10K 50/841* (2023.02); *H10K 50/8428* (2023.02)

(58) Field of Classification Search
  CPC ............ H01L 51/5237; H10K 50/8426; H10K 59/122; H10K 71/00; H10K 50/841; H10K 50/8428
  See application file for complete search history.

(56) References Cited

U.S. PATENT DOCUMENTS

| | | | | |
|---|---|---|---|---|
| 7,545,094 B2* | 6/2009 | Choi | .................... | H10K 50/841 313/506 |
| 7,834,550 B2* | 11/2010 | Lee | .................... | H10K 50/8426 445/25 |
| 7,837,530 B2* | 11/2010 | Park | .................... | H10K 50/8428 445/24 |
| 8,247,274 B2 | 8/2012 | Lee et al. | | |
| 9,577,215 B2* | 2/2017 | Hong | ................ | H10K 50/8426 |
| 10,937,840 B2 | 3/2021 | Lee et al. | | |
| 11,569,474 B2* | 1/2023 | Kim | .................... | H10K 71/621 |
| 2005/0248270 A1* | 11/2005 | Ghosh | ................ | H10K 50/846 313/511 |
| 2006/0009109 A1* | 1/2006 | Aitken | .................... | C03C 8/245 445/24 |
| 2007/0090759 A1* | 4/2007 | Choi | .................... | H10K 50/841 313/503 |
| 2007/0170423 A1 | 7/2007 | Choi et al. | | |
| 2007/0170605 A1 | 7/2007 | Lee et al. | | |
| 2007/0170839 A1* | 7/2007 | Choi | ....................... | C03C 27/06 313/500 |
| 2007/0170850 A1 | 7/2007 | Choi et al. | | |
| 2007/0170859 A1 | 7/2007 | Choi et al. | | |
| 2007/0173167 A1* | 7/2007 | Choi | ................. | H10K 50/8426 445/24 |
| 2007/0176185 A1* | 8/2007 | Lee | ....................... | H10K 50/84 438/22 |
| 2007/0176549 A1* | 8/2007 | Park | ......................... | C03C 8/02 313/512 |
| 2007/0177069 A1* | 8/2007 | Lee | .................... | H10K 50/8426 349/56 |
| 2007/0232182 A1* | 10/2007 | Park | .................... | H10K 50/8426 445/25 |
| 2009/0009063 A1* | 1/2009 | Botelho | .................. | C03C 27/06 313/317 |
| 2009/0064717 A1* | 3/2009 | Son | .......................... | C03C 8/08 501/15 |
| 2009/0206739 A1* | 8/2009 | Lee | .................... | H10K 50/8426 313/504 |
| 2010/0079065 A1* | 4/2010 | Kamiura | ................ | H10K 59/12 313/504 |
| 2012/0235557 A1* | 9/2012 | Lee | .................... | H10K 50/8426 313/495 |
| 2012/0287026 A1 | 11/2012 | Masuda | | |
| 2012/0319092 A1* | 12/2012 | Shimomura | .......... | H01L 27/156 428/188 |
| 2014/0061596 A1* | 3/2014 | Wu | ..................... | H01L 33/0095 438/26 |
| 2014/0061623 A1* | 3/2014 | Drake | ....................... | C03C 3/21 501/15 |
| 2014/0103312 A1* | 4/2014 | Huang | ................... | H10K 59/00 257/40 |
| 2014/0160710 A1* | 6/2014 | Yan | .................... | G02F 1/133308 361/748 |
| 2015/0009646 A1 | 1/2015 | Han | | |
| 2015/0021568 A1 | 1/2015 | Gong et al. | | |
| 2015/0270508 A1 | 9/2015 | Naito et al. | | |
| 2016/0138325 A1 | 5/2016 | Dennis | | |
| 2016/0181568 A1* | 6/2016 | Jung | ................. | H10K 50/8426 257/40 |
| 2016/0293881 A1* | 10/2016 | Wang | .................... | H10K 71/00 |
| 2016/0326044 A1* | 11/2016 | Dietz | ....................... | C03C 3/122 |
| 2019/0081091 A1* | 3/2019 | Xin | ..................... | H01L 27/124 |
| 2019/0140209 A1* | 5/2019 | Hamer | ............... | H10K 50/8426 |
| 2020/0119302 A1 | 4/2020 | Kim et al. | | |
| 2020/0144536 A1 | 5/2020 | Kim et al. | | |

FOREIGN PATENT DOCUMENTS

| | | |
|---|---|---|
| KR | 10-1084175 | 11/2011 |
| KR | 10-2015-0005015 | 1/2015 |
| KR | 10-2015-0011235 | 1/2015 |
| KR | 10-2020-0042063 | 4/2020 |

* cited by examiner

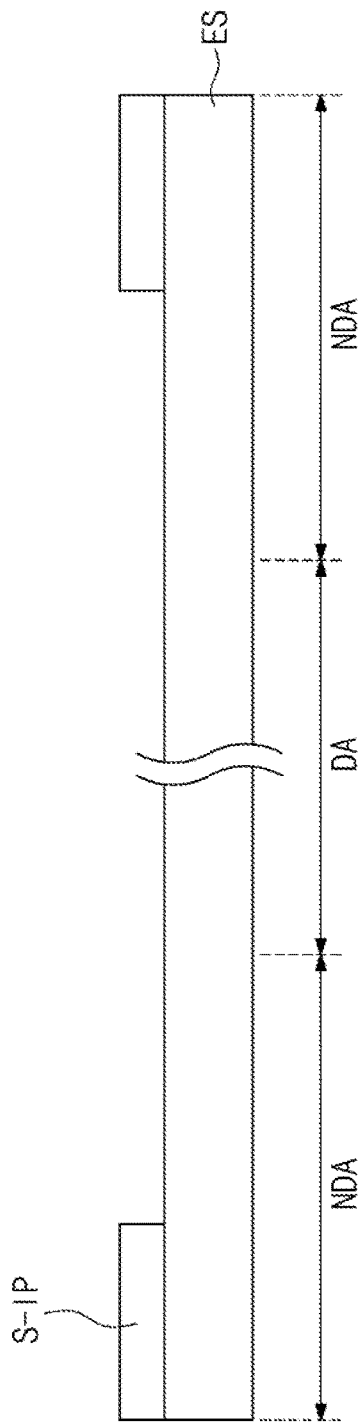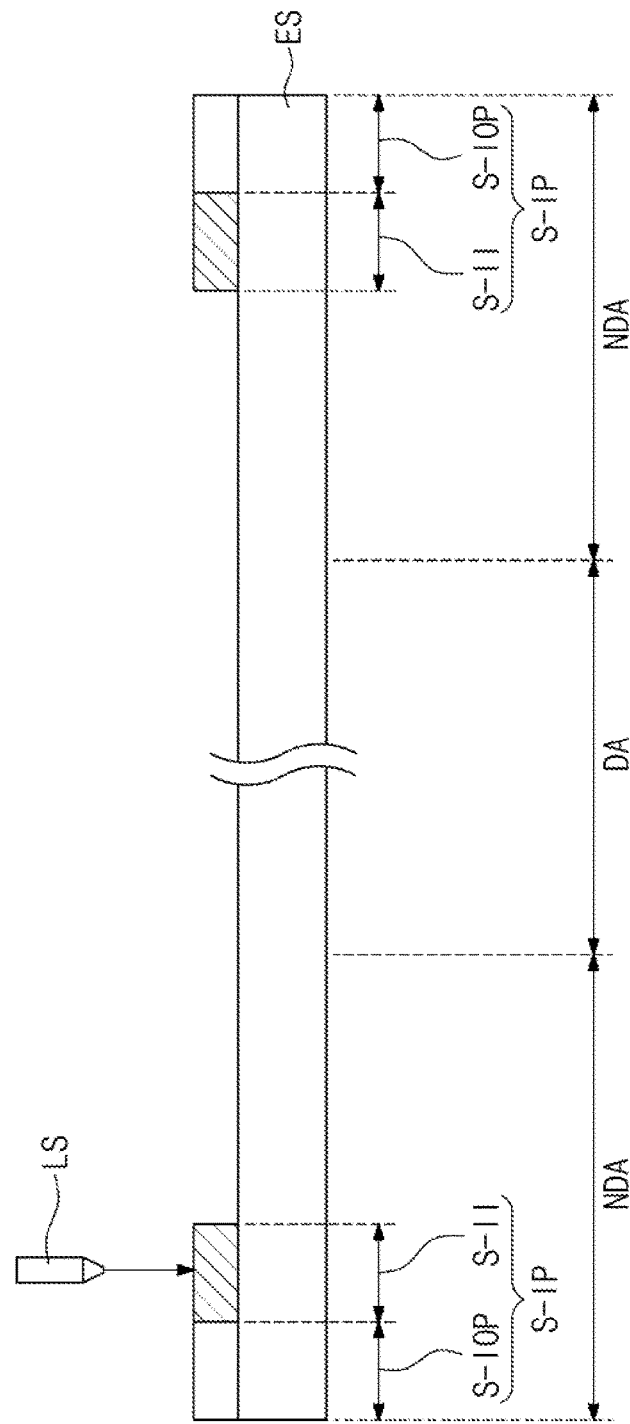

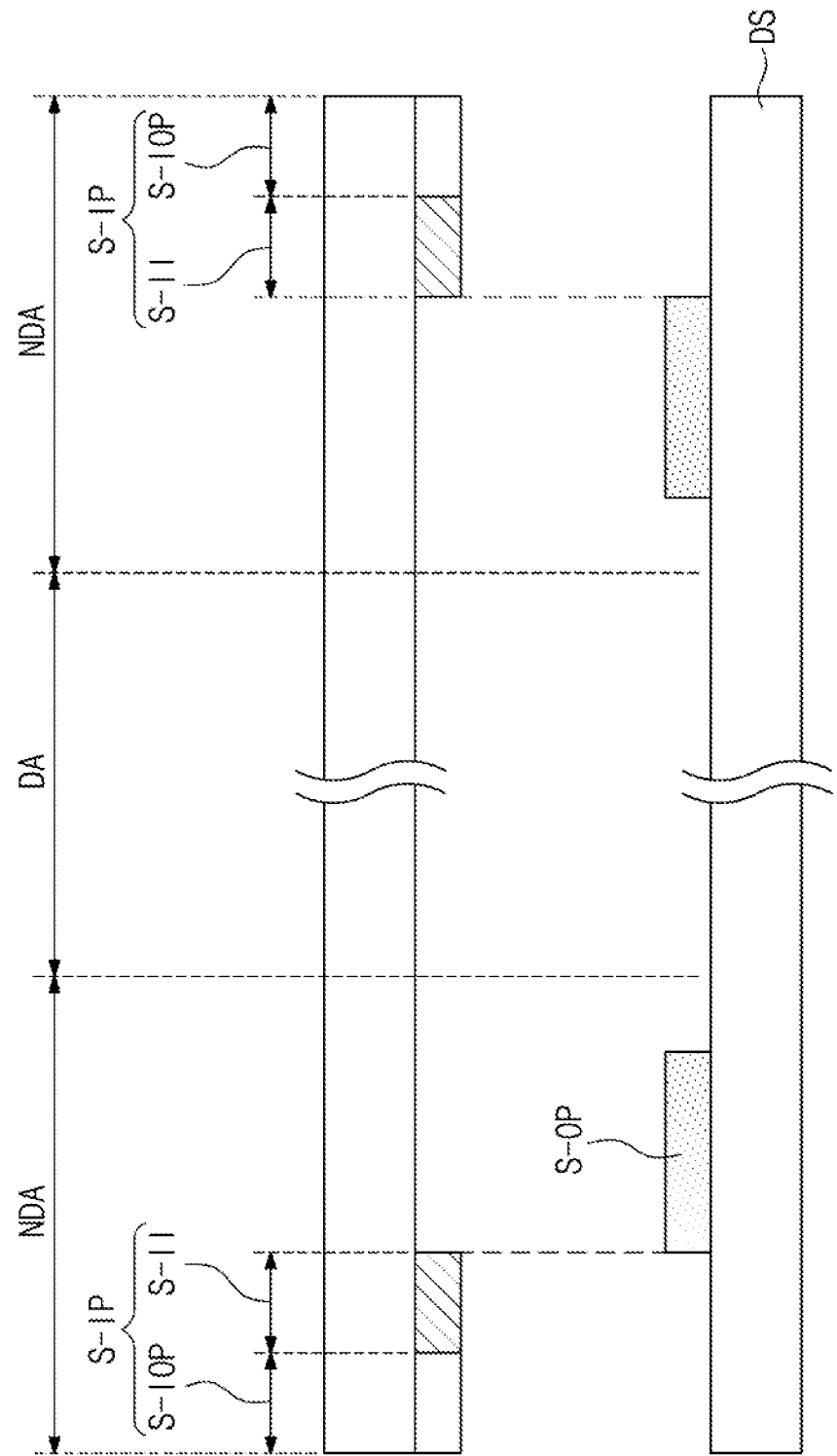

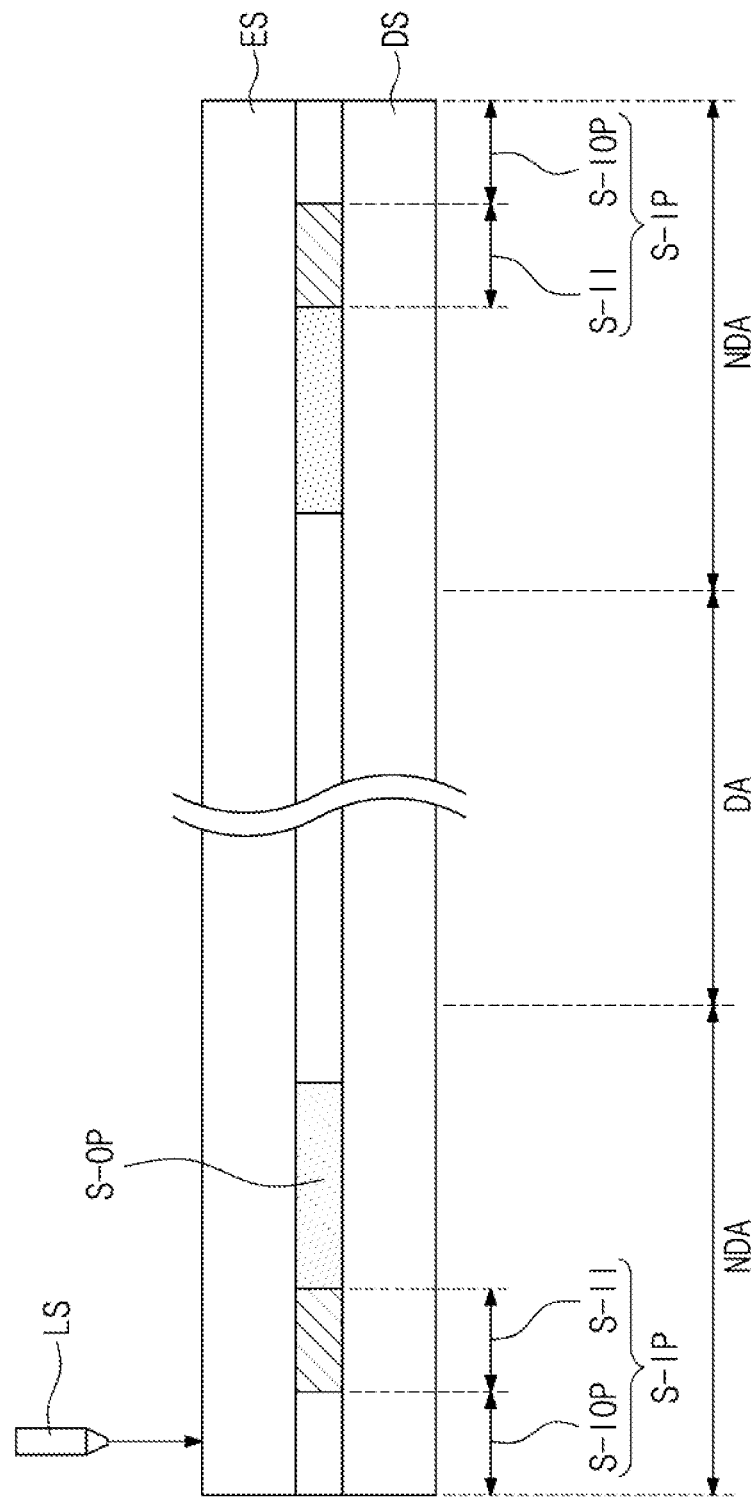

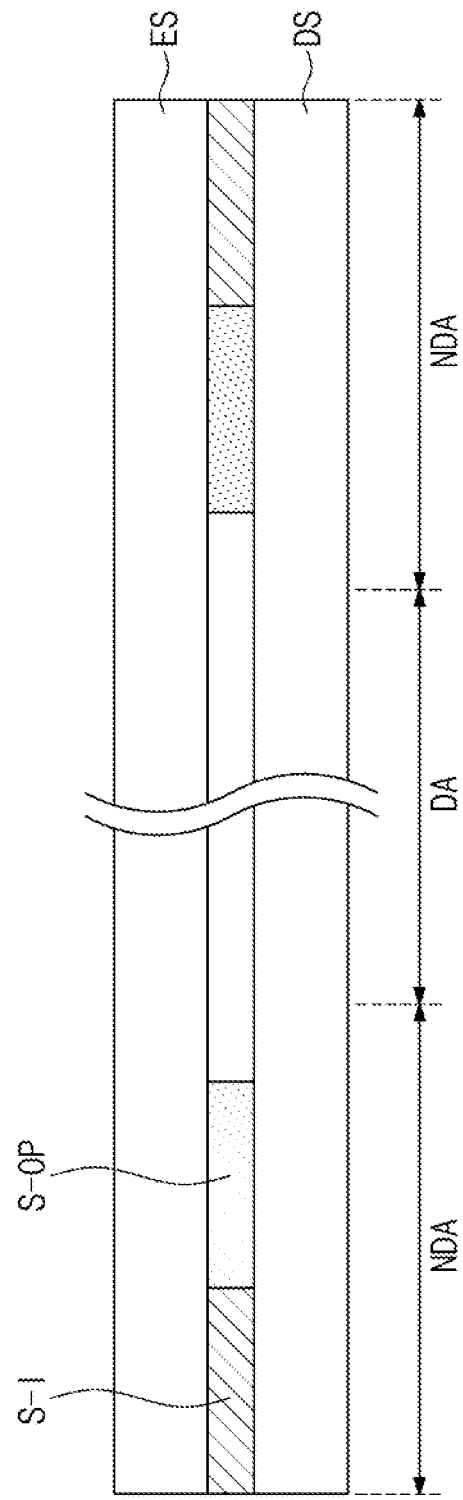

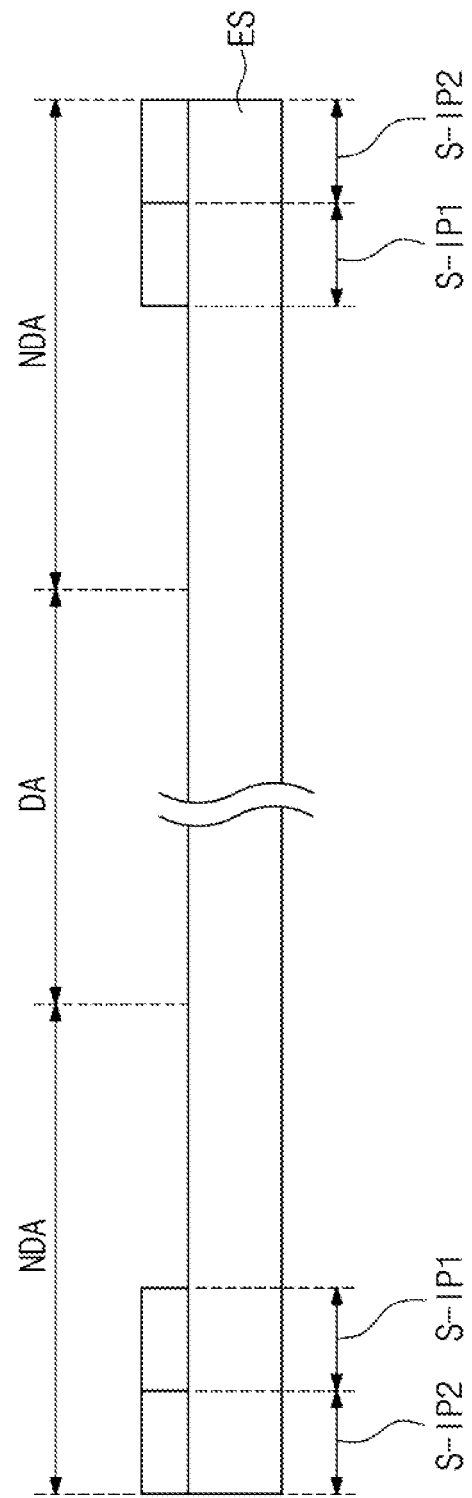

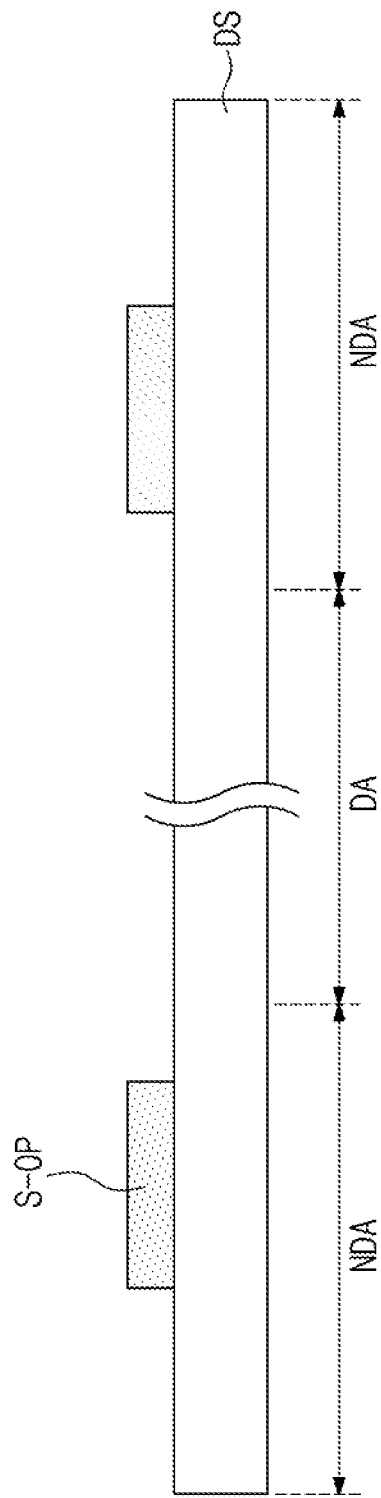

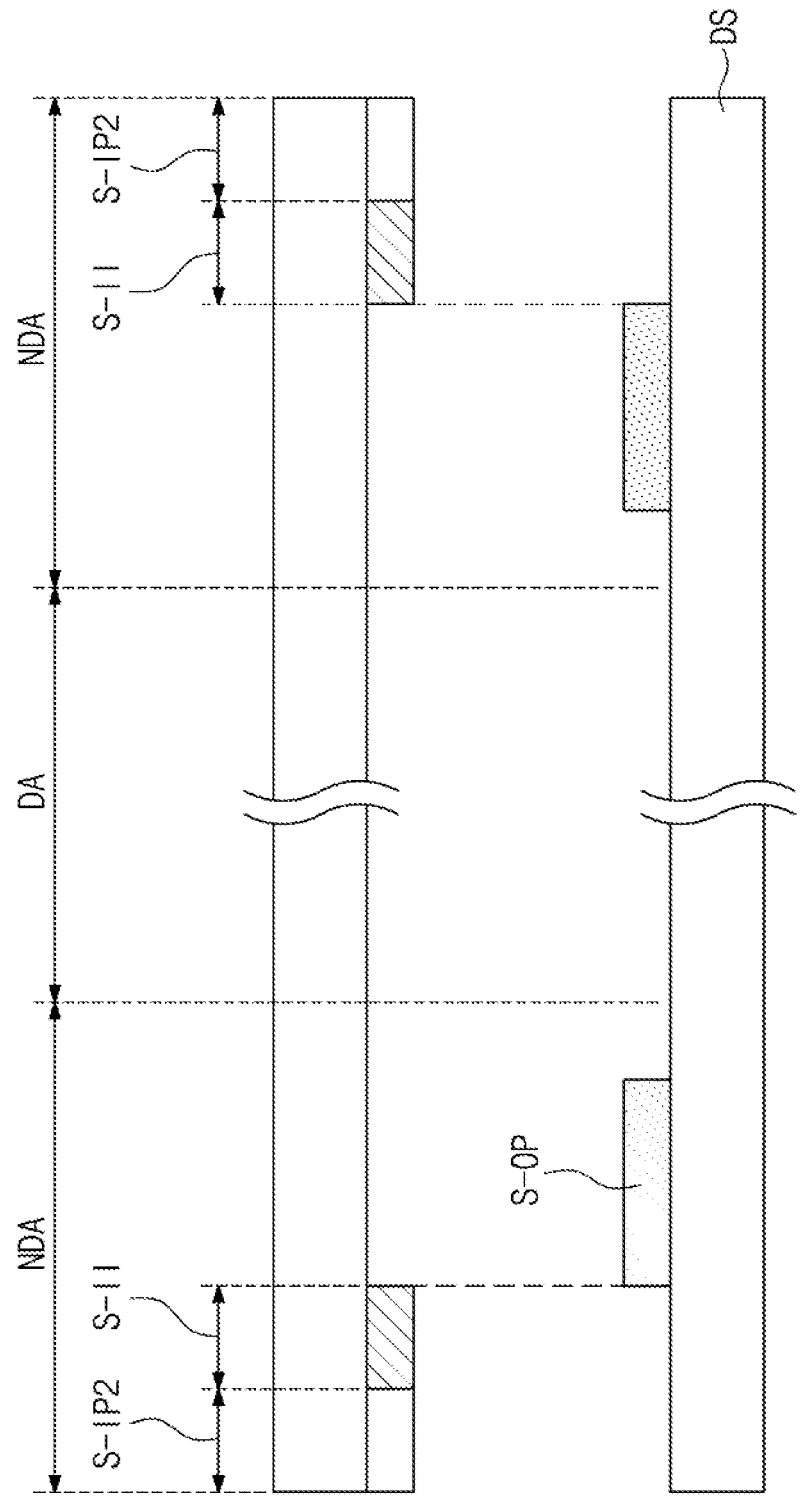

DISPLAY DEVICE AND METHOD OF FABRICATING THE SAME

CROSS-REFERENCE TO RELATED APPLICATIONS

This U.S. non-provisional patent application is a divisional application of U.S. patent application Ser. No. 16/672,953, filed on Nov. 4, 2019, which claims priority under 35 U.S.C. § 119 to Korean Patent Application No. 10-2018-0134605, filed on Nov. 5, 2018, in the Korean Intellectual Property Office, the entire contents of which are herein incorporated by reference.

TECHNICAL FIELD

The present inventive concept relates to a display device and a method of fabricating the same, and in particular, to a display device including a sealing member and a method of fabricating the same.

DISCUSSION OF RELATED ART

Currently, researches are being conducted to develop various display devices for use in multimedia devices, such as televisions, mobile phones, tablet computers, navigation systems, and gaming machines, especially to develop those display devices having enhanced durability and reduced non-display region. A display device may include a sealing member, which is used to bond a first display substrate and a second display substrate. To enhance durability, various sealing members are being developed to enhance impact strength of the display device and to effectively prevent moisture penetration.

SUMMARY

An example embodiment of the present inventive concept provides a display device, which has a high impact strength and effectively prevents penetration of moisture.

An example embodiment of the present inventive concept provides a method of reducing an amount of gas, which is produced in a process of fabricating a sealing member of a display device.

According to an example embodiment of the present inventive concept, a method of fabricating a display panel may include providing a first display substrate and a second display substrate, forming a preliminary frit sealing member on a surface of one of the first display substrate and the second display substrate, the preliminary frit sealing member including an outer region and an inner region, crystalizing the inner region of the preliminary frit sealing member, forming a preliminary organic sealing member on a surface of one of the first display substrate and the second display substrate, bonding the first display substrate and the second display substrate such that the preliminary frit sealing member and the preliminary organic sealing member are disposed between the first display substrate and the second display substrate in a cross-sectional view and the preliminary organic sealing member is disposed next to an inner side of the preliminary frit sealing member in a plan view, crystalizing the outer region of the preliminary frit sealing member, and curing the organic sealing member.

In an example embodiment of the present inventive concept, the crystalizing of the inner region may include irradiating the inner region with a laser beam.

In an example embodiment of the present inventive concept, in the forming of the preliminary frit sealing member, the preliminary frit sealing member may be formed on a surface of the second display substrate. In the forming of the preliminary organic sealing member, the preliminary organic sealing member may be formed on a surface of the first display substrate.

In an example embodiment of the present inventive concept, in the bonding of the first display substrate and the second display substrate, the inner region of the preliminary frit sealing member may be in contact with the preliminary organic sealing member.

According to an example embodiment of the present inventive concept, a method of fabricating a display panel may include providing a first display substrate and a second display substrate, at least one of the first display substrate and the second display substrate including a display region provided with a pixel and a non-display region adjacent to the display region, forming a first preliminary frit sealing member on a surface of one of the first display substrate and the second display substrate, forming a second preliminary frit sealing member on a surface of one of the first display substrate and the second display substrate to be disposed next to an outer side of the first preliminary frit sealing member in a plan view, crystalizing the first preliminary frit sealing member, forming a preliminary organic sealing member on a surface of one of the second display substrate and the first display substrate, bonding the first display substrate and the second display substrate such that the first preliminary frit sealing member, the second preliminary frit sealing member, and the preliminary organic sealing member are disposed between the first display substrate and the second display substrate in a cross-sectional view and are overlapped with the non-display region in the plan view and that the preliminary organic sealing member is disposed next to an inner side of the first preliminary frit sealing member, crystalizing the second preliminary frit sealing member, and curing the organic sealing member in the plan view.

In an example embodiment of the present inventive concept, a ratio in weight of vanadium (V) to zinc (Zn) in the first preliminary frit sealing member may be lower than a ratio in weight of vanadium (V) to zinc (Zn) in the second preliminary frit sealing member.

In an example embodiment of the present inventive concept, the first preliminary frit sealing member and the second preliminary frit sealing member may be simultaneously formed on a surface of the second display substrate.

In an example embodiment of the present inventive concept, the first preliminary frit sealing member and the second preliminary frit sealing member may be in contact with each other.

In an example embodiment of the present inventive concept, the crystalizing of the first preliminary frit sealing member may include heating the first preliminary frit sealing member and the second preliminary frit sealing member.

In an example embodiment of the present inventive concept, a crystallization temperature of the first preliminary frit sealing member may be lower than a crystallization temperature of the second preliminary frit sealing member by about 5° C. to about 50° C.

In an example embodiment of the present inventive concept, a crystallization temperature of the first preliminary frit sealing member may range from about 240° C. to about 260° C., and a crystallization temperature of the second preliminary frit sealing member may range from about 290° C. to about 310° C.

In an example embodiment of the present inventive concept, in the heating of the first preliminary frit sealing member and the second preliminary frit sealing member, the first preliminary frit sealing member and the second preliminary frit sealing member are heated to a temperature in a range from about 250° C. to about 280° C.

In an example embodiment of the present inventive concept, a crystallization temperature of the first preliminary frit sealing member may range from about 390° C. to about 410° C., and a crystallization temperature of the second preliminary frit sealing member may range from about 440° C. to about 460° C.

In an example embodiment of the present inventive concept, in the heating of the first preliminary frit sealing member and the second preliminary frit sealing member, the first preliminary frit sealing member and the second preliminary frit sealing member are heated to a temperature in a range from about 400° C. to about 430° C.

In an example embodiment of the present inventive concept, the crystalizing of the second preliminary frit sealing member may include irradiating the second preliminary frit sealing member with a laser beam.

According to an example embodiment of the present inventive concept, a display panel may include a first display substrate including a base substrate including a display region and a non-display region, a circuit layer disposed on the base substrate, and display elements disposed on the circuit layer and overlapped with the display region, a second display substrate disposed over the first display substrate, and a sealing member bonding the first display substrate and the second display substrate. The sealing member may include a frit sealing member including an outer region and an inner region, with the inner region disposed next to an inner side of the outer region and having a first crystallization temperature lower than a second crystallization temperature of the outer region, and an organic sealing member disposed next to an inner side of the frit sealing member.

In an example embodiment of the present inventive concept, the first crystallization temperature of the inner region may be lower than the second crystallization temperature of the outer region by about 5° C. to about 50° C.

In an example embodiment of the present inventive concept, the circuit layer may include an inorganic layer, and the frit sealing member may be in contact with the inorganic layer and a bottom surface of the second display substrate.

In an example embodiment of the present inventive concept, the circuit layer may include an inorganic layer, the second display substrate may include a glass substrate and a buffer layer, with the buffer layer disposed on a bottom surface of the glass substrate, and the frit sealing member may be in contact with the inorganic layer and the buffer layer.

In an example embodiment of the present inventive concept, the display elements may include organic light emitting elements. The first display substrate may further include a pixel definition layer including an edge portion, which is overlapped with the non-display region, and a center portion, which is overlapped with the display region and is disposed on the circuit layer. Openings corresponding to the organic light emitting elements may be defined in the center portion. The organic sealing member may be in contact with the edge portion.

In an example embodiment of the present inventive concept, the circuit layer may include a power electrode, which is overlapped with the edge portion and is electrically connected to the organic light emitting elements.

In an example embodiment of the present inventive concept, a ratio in weight of vanadium (V) to zinc (Zn) in the inner region may be lower than a ratio in weight of vanadium (V) to zinc (Zn) in the outer region.

According to an example embodiment of the present inventive concept, a display panel may include a first display substrate including a base substrate including a display region and a non-display region, a circuit layer disposed on the base substrate, and display elements disposed on the circuit layer and overlapped with the display region, a second display substrate disposed over the first display substrate, and a frit sealing member and an organic sealing member interposed between the first display substrate and the second display substrate, overlapped with the non-display region, surrounding the display elements, and bonding the first display substrate and the second display substrate. The organic sealing member is closer to the display elements than the frit sealing member and surrounded by the frit sealing member. The frit sealing member includes an outer frit sealing member which is at or close to edges of the first and second display substrates, and an inner frit sealing member which is disposed next to an inner side of the outer frit sealing member and next to an outer side of the organic sealing member. The frit sealing member includes vanadium (V) and zinc (Zn), with a ratio in weight of vanadium (V) to zinc (Zn) in the inner frit sealing member being lower than a ratio in weight of vanadium (V) to zinc (Zn) in the outer frit sealing member.

In an example embodiment of the present inventive concept, the frit sealing member includes silver (Ag).

BRIEF DESCRIPTION OF THE DRAWINGS

Example embodiments of the present inventive concept will be more clearly understood from the following detailed description taken in conjunction with the accompanying drawings, in which:

FIGS. 9A to 9F are cross-sectional views illustrating a method of fabricating a display panel according to an example embodiment of the present inventive concept;

FIGS. 11A to 11F are cross-sectional views illustrating a method of fabricating a display panel according to an example embodiment of the present inventive concept;

Figure 1:
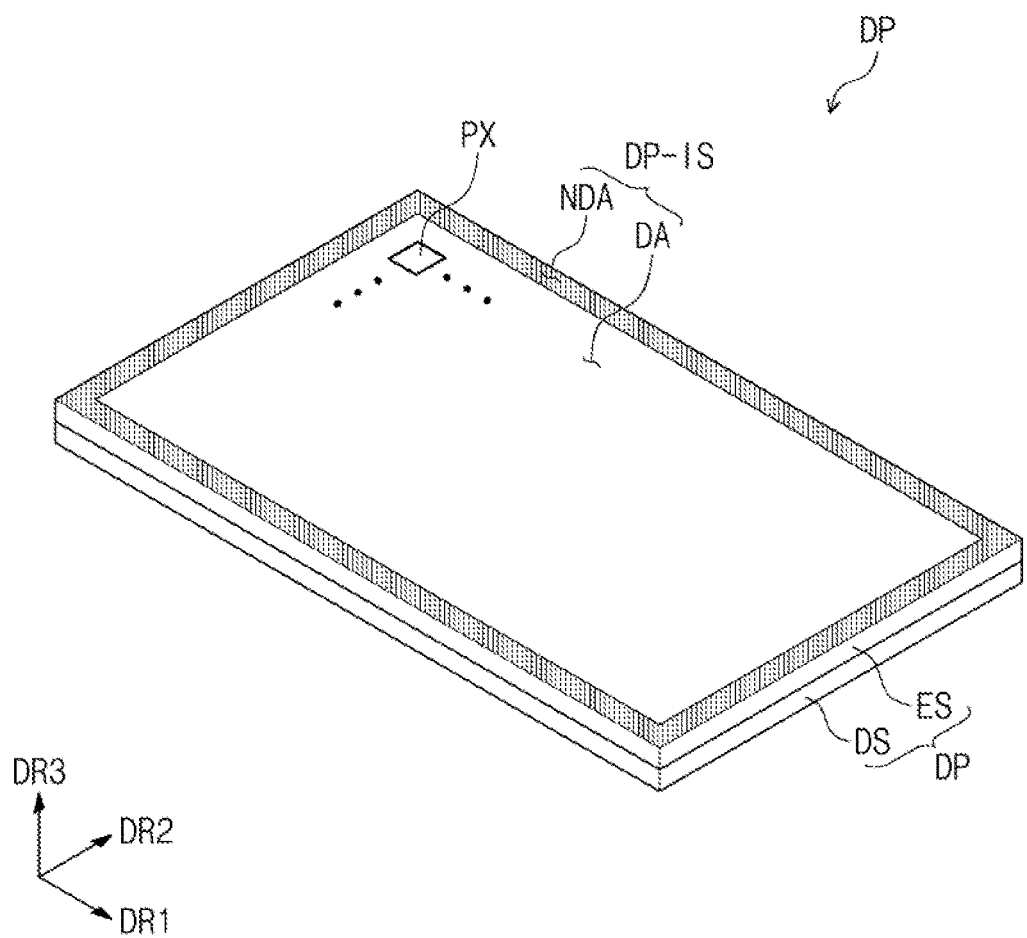
FIG. 1 is a perspective view illustrating a display device according to an example embodiment of the present inventive concept.

Since the drawings in FIGS. 1-12B are intended for illustrative purposes, the elements in the drawings are not necessarily drawn to scale. For example, some of the elements may be enlarged or exaggerated for clarity purpose. The use of similar or identical reference numbers in the various drawings is intended to indicate the presence of a similar or identical element or feature.

DETAILED DESCRIPTION OF THE EMBODIMENTS

Example embodiments of the present inventive concept will now be described more fully with reference to the accompanying drawings, in which the example embodiments are shown. Example embodiments of the present inventive concept may, however, be embodied in many different forms and should not be construed as being limited to the specific example embodiments set forth herein, rather, these example embodiments are provided so that the present inventive concept will be thorough and complete, and will fully convey the concept of the example embodiments to those of ordinary skill in the art. Like reference numerals in the drawings denote like elements, and thus their redundant description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between", "adjacent" versus "directly adjacent", "on" versus "directly on"). Like numbers refer to like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, and vice versa, without departing from the teachings of the present inventive concept.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including" if used herein, specify the presence of stated features, integers, steps, operations, elements, components and/or groups, but do not preclude the presence or addition of one or more other features, integers, steps, operations, elements, components and/or groups thereof.

When the term "about" is used in this specification in connection with a numerical value, it is intended that the associated numerical value includes a tolerance of up to ±10% around the stated numerical value.

Example embodiments of the present inventive concept are described herein with reference to cross-sectional illustrations that are schematic illustrations of idealized embodiments (and intermediate structures) of the example embodiments. As such, variations from the shapes of the illustrations as a result, for example, of manufacturing techniques and/or tolerances, are to be expected. Thus, example embodiments of the present inventive concept should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly-used dictionaries, should be interpreted as having meanings that are consistent with their meanings in the context of the relevant art and will not be interpreted in an idealized or overly formal sense unless expressly so defined herein.

Figure 2:
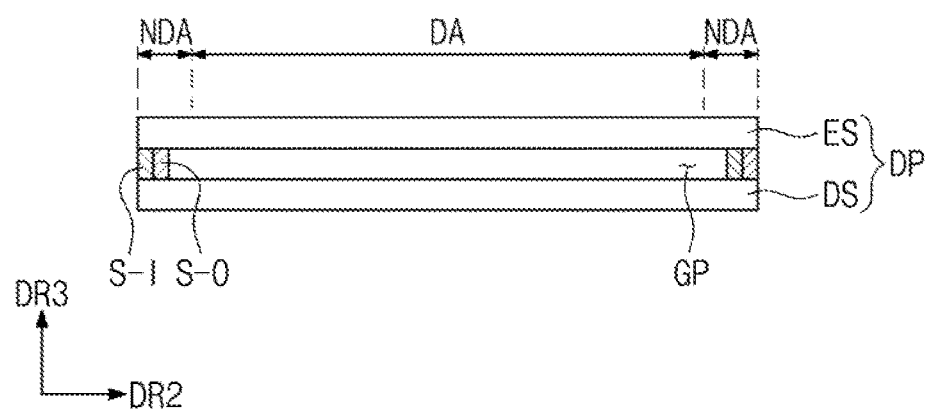
FIG. 2 is a cross-sectional view illustrating a display device according to an example embodiment of the present inventive concept.
Figure 3:
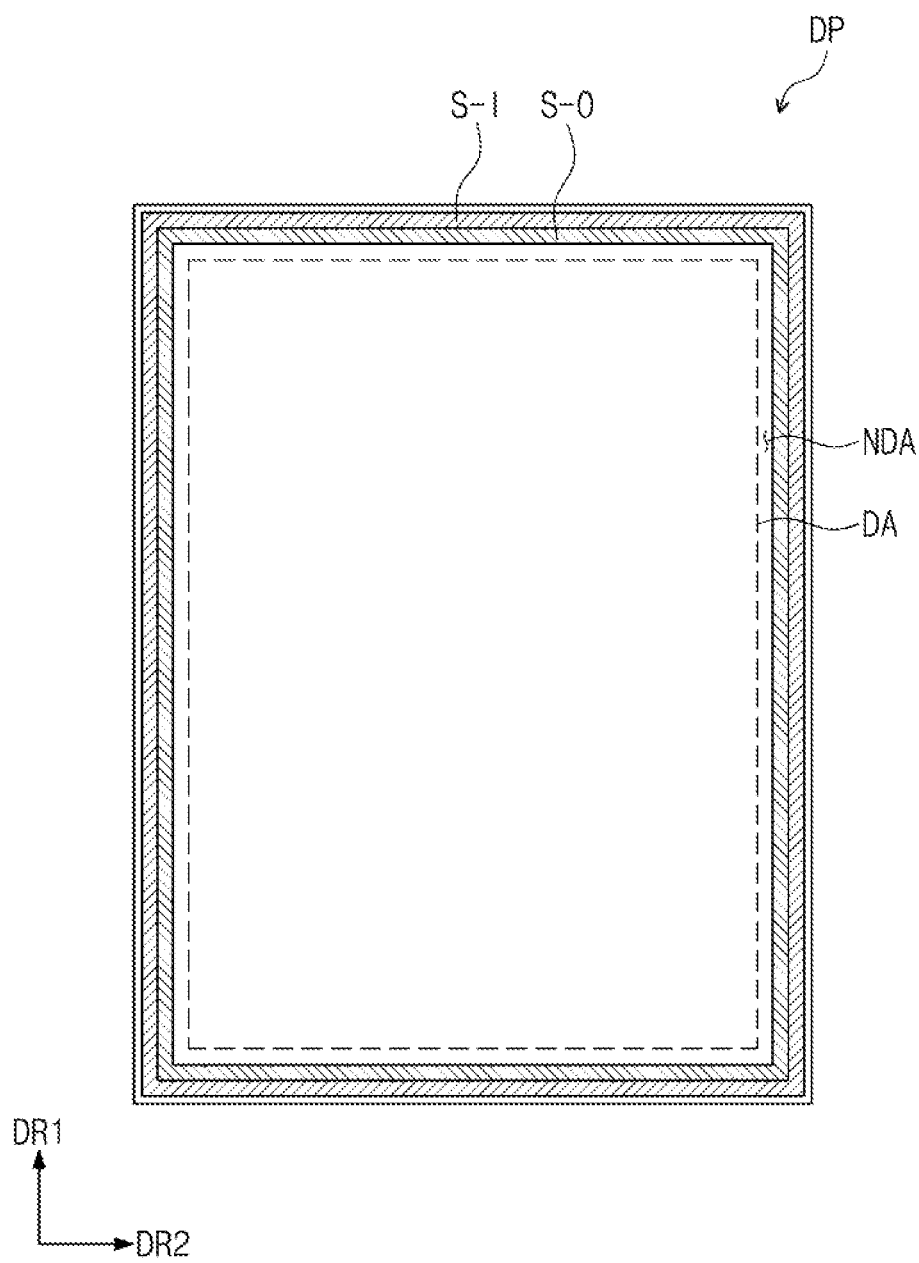
FIGS. 3 and 4 are plan views illustrating a display panel according to an example embodiment of the present inventive concept.
Figure 4:
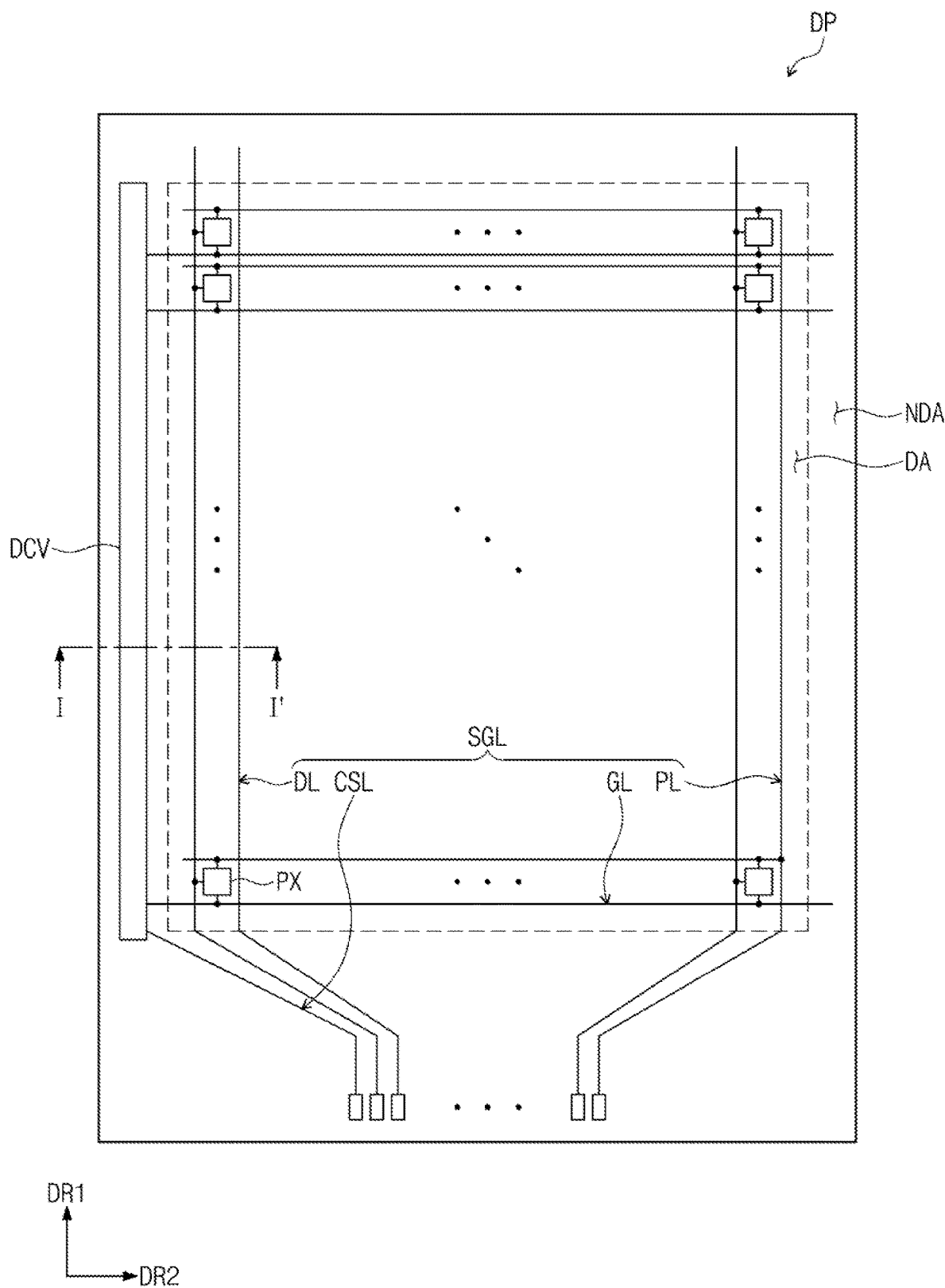

FIG. 1 is a perspective view illustrating a display panel DP according to an example embodiment of the present inventive concept. FIG. 2 is a cross-sectional view illustrating the display panel DP according to an example embodiment of the present inventive concept. FIGS. 3 and 4 are plan views illustrating the display panel DP according to an example embodiment of the present inventive concept.

Referring to FIGS. 1 to 4, the display panel DP may be one of a liquid crystal display panel, an electrophoretic display panel, a microelectromechanical system (MEMS) display panel, an electrowetting display panel, an electrochromic display panel and an organic light emitting display panel, but the present inventive concept is not limited thereto.

The display panel DP may further include a chassis member or a molding member and may further include a backlight unit, depending on the kind of the display panel DP is used. For example, a liquid crystal display panel may include a backlight unit and multiple chassis members.

As shown in FIGS. 1 and 2, the display panel DP may include a first or lower display substrate DS and a second or upper display substrate ES, which is spaced apart from the first display substrate DS and faces the first display substrate DS. A cell gap GP may be formed between the first display substrate DS and the second display substrate ES, and may be maintained by sealing members S-I and S-O coupling the first display substrate DS and the second display substrate ES to each other. For example, the combination of the sealing members S-I and S-O, the first display substrate DS and the second display substrate ES may form an enclosed space which includes the cell gap GP.

As shown in FIG. 1, the display panel DP may include a display surface DP-IS displaying an image. The display surface DP-IS may be parallel to a plane defined by a first direction DR1 and a second direction DR2, and may include a display region DA and a non-display region NDA. A pixel PX may be disposed in the display region DA, and may not be disposed in the non-display region NDA. The pixel PX may include a light emitting element OLED, e.g., organic light emitting diode, as a display element to be described. The non-display region NDA may be defined along an edge of the display surface DP-IS. The display region DA may be enclosed by the non-display region NDA.

A normal direction of the display surface DP-IS (i.e., a thickness direction of the display panel DP) will be referred to as a third direction DR3. The third direction DR3 may be used to differentiate a front or top surface of each element (e.g., a layer or a unit) from a back or bottom surface.

In an example embodiment of the present inventive concept, the display surface DP-IS of the display panel DP is illustrated to be a flat type, but the present inventive concept is not limited thereto. For example, the display panel DP may have a curved display surface or a three-dimensional display surface. The three-dimensional display surface, in which images are generated within a display volume rather than upon a stationary surface, may include a plurality of display regions, which are oriented in different directions.

As shown in FIGS. 2 and 3, the sealing members S-I and S-O may be overlapped with the non-display region NDA in the third direction DR3. In the present application, the word "overlap" always refers to the overlap of one object with another object in the third direction DR3. The sealing members S-I and S-O may include a frit sealing member S-I and an organic sealing member S-O. The frit sealing member S-I may be disposed outside the organic sealing member S-O, and may be aligned to a side surface of the display panel DP. Each of the frit sealing member S-I and the organic sealing member S-O may have a closed-line shape, when viewed in a plan view. For example, the frit sealing member S-I and the organic sealing member S-O may be interposed between the first display substrate DS and the second display substrate ES, overlapped with the non-display region NDA, surrounding display elements disposed in the display region DA, and bonding the first display substrate DS and the second display substrate ES. The organic sealing member S-O may be closer to the display region DA than the frit sealing member S-I and may be enclosed by the frit sealing member S-I.

The frit sealing member S-I may include frit. The frit may include a crystalized base or mother glass. The term "crystalized base glass" may refer to not only a fully crystalized base glass but also a partially crystalized base glass.

The base glass may be a vanadium-based or palladium-based glass. In other words, the base glass may include vanadium (V) or palladium (Pd). The base glass may further include tellurium oxide ($TeO_2$), zinc oxide (ZnO), barium oxide (BaO), bismuth oxide ($Bi_2O_3$), boron oxide ($B_2O_3$), aluminum oxide ($Al_2O_3$), cerium oxide ($CeO_2$), titanium oxide ($TiO_2$), calcium oxide (CaO), tungsten oxide ($WO_3$) and so forth. The frit sealing member S-I may further include a filler. The filler may include ceramics. In an example embodiment of the present inventive concept, a plurality of the fillers may be dispersed in the mother glass to maintain the shape of the crystalized base glass. In an example embodiment of the present inventive concept, the filler(s) may be provided in the frit to adjust an overall thermal expansion characteristic of the frit sealing member S-I, such that stress may be relaxed and cracks may be prevented in bonding region.

The frit sealing member S-I may prevent oxygen and/or moisture, which are provided from the outside of the display panel DP, from entering the cell gap GP. The frit sealing member S-I may enhance a bonding strength between the first display substrate DS and the second display substrate ES. Inorganic materials are usually dense and not permeable to oxygen and/or moisture. Since the frit sealing member S-I is formed of inorganic materials including crystalized base glass and/or ceramics, the frit sealing member S-I may prevent oxygen and/or moisture from entering the cell gap GP to cause degradation of display elements and circuit components in the display region DA.

The organic sealing member S-O may include a synthetic resin (e.g., epoxy resin). The organic sealing member S-O may further include an ultraviolet light curing agent (e.g., bisphenol-F) or an additive material (e.g., bisphenol-A, acryl, or phenyl silicone). The organic sealing member S-O may also enhance a bonding strength between the first display substrate DS and the second display substrate ES. Since the organic sealing member S-O has an elastic property, the organic sealing member S-O may relieve a stress between the first display substrate DS and the second display substrate ES and may absorb an external impact, which may occur when the display panel DP falls down. In addition, even when, owing to the falling of the display panel DP, a crack occurs in a region of the first display substrate DS and the second display substrate ES, which is adjacent to the frit sealing member S-I, the organic sealing member S-O may prevent the crack from being grown. In other words, the organic sealing member S-O may prevent crack formation and/or crack propagation from occurring in a region of the first display substrate DS and the second display substrate ES.

FIG. 4 schematically illustrates the arrangement of signal lines SGL and pixels PX in a plan view. The signal lines SGL may include a plurality of gate lines GL and a plurality of data lines DL.

Each of the pixels PX may be connected to a corresponding one of the gate lines GL and a corresponding one of the data lines DL, and may include a pixel driving circuit and a display element. The gate lines GL may be spaced apart from each other in the first direction DR1 and extending in the second direction DR2, while the data line DL may be spaced apart from each other in the second direction DR2 and extending in the first direction DR1. According to the structure of the pixel driving circuit of the pixels PX, signal lines of other types may be further provided in the display panel DP.

An example in which the pixels PX are arranged in a matrix shape is illustrated in FIG. 4, but the present inventive concept is not limited thereto. For example, the pixels PX may be arranged in a pentile matrix shape, or a diamond shape.

A gate driving circuit DCV, to which the gate lines GL are connected, may be disposed in a region of the non-display region NDA. A control signal line CSL may provide control signals to the gate driving circuit DCV. Each of the control signals provided by the control signal line CSL may include a vertical start signal for controlling the operation of the gate driving circuit DCV and at least one clock signal for determining the output timing of signals. The gate driving circuit DCV may be integrated on the display panel DP through an oxide silicon gate driver circuit (OSG) or amorphous silicon gate driver circuit (ASG) process. The gate driving circuit DCV may include a plurality of transistors, a plurality of electrodes, and a plurality of conductive lines. The plurality of transistors may constitute a stage circuit sequentially outputting scan signals (gate signals) to the gate lines GL.

Figure 5:
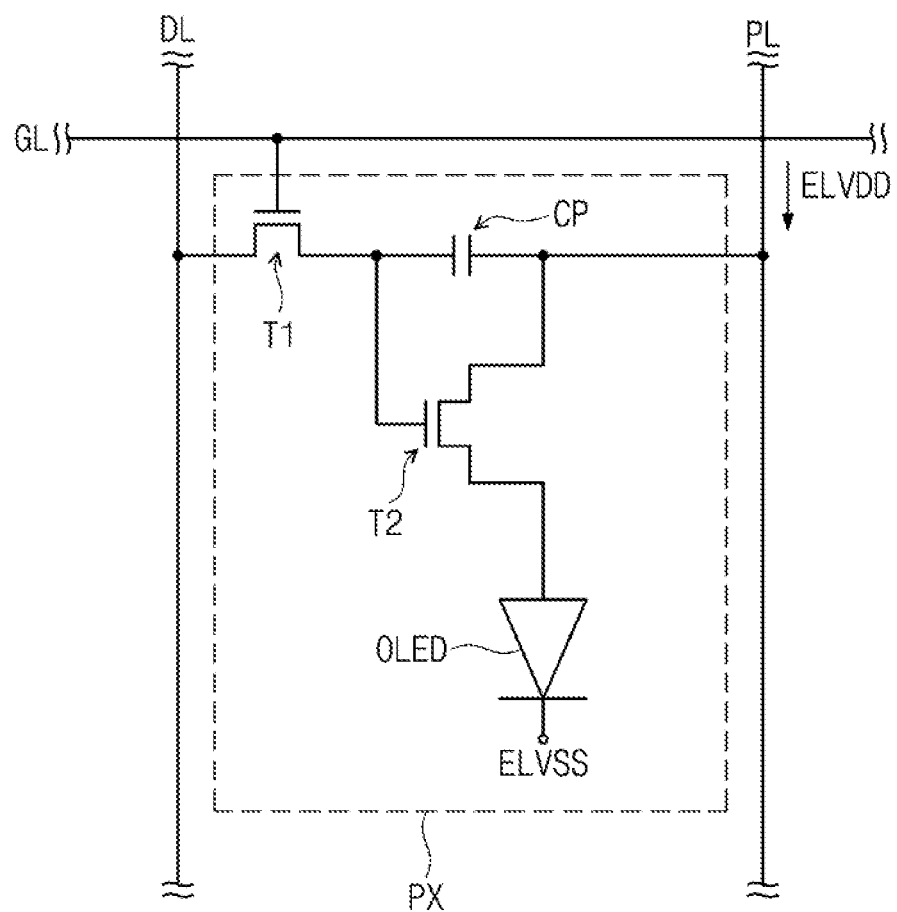
FIG. 5 is an equivalent circuit diagram illustrating a pixel according to an example embodiment of the present inventive concept.
Figure 6:
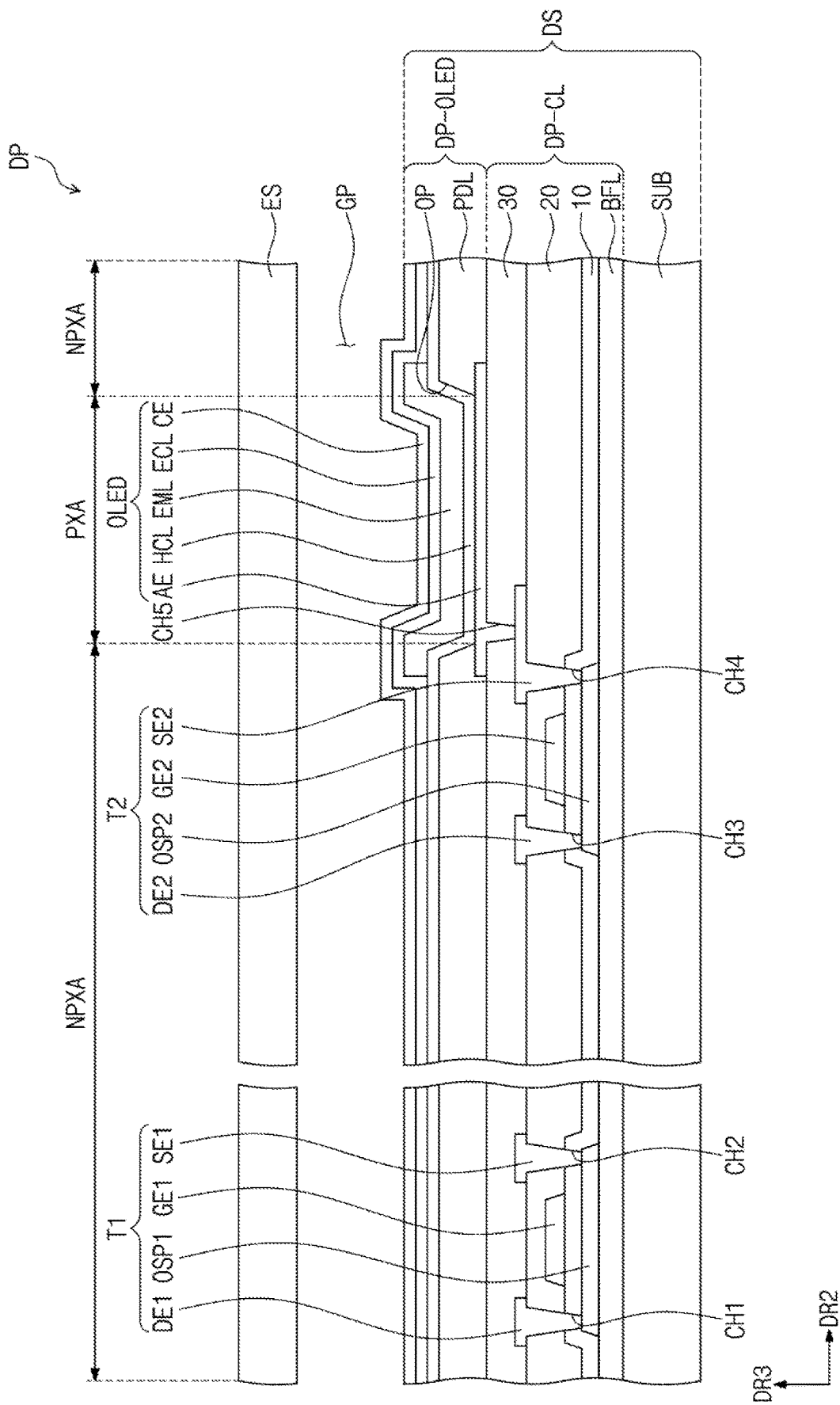
FIG. 6 is an enlarged cross-sectional view illustrating a display panel according to an example embodiment of the present inventive concept.

FIG. 5 is an equivalent circuit diagram illustrating the pixel PX according to an example embodiment of the present inventive concept. FIG. 6 is an enlarged cross-sectional view illustrating the display panel DP according to an example embodiment of the present inventive concept.

FIG. 5 illustrates an example of the pixel PX connected to one gate line GL, one data line DL, and a power line PL. The structure of the pixel PX may not be limited to this example and may be variously modified.

The pixel PX may include a light emitting element OLED, which is used as a display element. The light emitting element OLED may be a top-emission type diode or a bottom-emission type diode. Alternatively, the light emitting element OLED may be a double-sided emission type diode. The light emitting element OLED may be an organic light emitting diode. Thus, the display element may include an organic light emitting element. The pixel PX may include a switching transistor T1, a driving transistor T2, and a capacitor CP, which constitute a circuit for driving the light emitting element OLED. The light emitting element OLED may generate light in response to electrical signals transmitted from the transistors T1 and T2. The capacitor CP may include a first electrode connected to the switching transistor T1 and a second electrode receiving a first power voltage ELVDD. The capacitor CP may be charged with a voltage corresponding to a data signal received from the switching transistor T1. The light emitting element OLED may emit light using the first power voltage ELVDD (positive output) and a second power voltage ELVSS (negative output), and here, an intensity of the light emitted from the light emitting element OLED may be determined by an amount of charges stored in the capacitor CP. The first power voltage ELVDD may be higher than the second power voltage ELVSS.

As shown in FIG. 6, the first display substrate DS may include a first base substrate SUB, a circuit layer DP-CL disposed on the first base substrate SUB, and a display element layer DP-OLED disposed on the circuit layer DP-CL.

The first base substrate SUB may include a synthetic resin substrate or a glass substrate. The display region DA and the non-display region NDA shown in FIG. 1 may be defined in the first base substrate SUB. For example, the first display substrate DS may include the first base substrate SUB which includes the display region DA and the non-display region NDA, the circuit layer DP-CL may be disposed on the first base substrate SUB, and the display elements, such as the light emitting elements OLED may be disposed on the circuit layer DP-CL and overlapped with the display region DA of the first base substrate SUB.

The circuit layer DP-CL may include at least one insulating layer and a circuit device. The circuit device may include signal lines, pixel driving circuits, and so forth. The formation of the circuit layer DP-CL may include forming an insulating layer, a semiconductor layer, and a conductive layer using a coating or deposition process and patterning the insulating layer, the semiconductor layer, and the conductive layer using a photolithography process and/or an etching process.

In the present example embodiment, the circuit layer DP-CL may include a buffer layer BFL, a first insulating layer 10, a second insulating layer 20, and a third insulating layer 30. The first insulating layer 10 and the second insulating layer 20 may be inorganic layers, and the third insulating layer 30 may be an organic layer. The second insulating layer 20 may include, for example, a silicon oxynitride (SiON) layer, a silicon oxide ($SiO_2$) layer, or a silicon nitride ($Si_3N_4$) layer. In an example embodiment of the present inventive concept, the third insulating layer 30 may include a polymer, for example, an acrylic resin, but the present inventive concept is not limited thereto. For example, any suitable organic insulating layer may be used for the third insulating layer 30.

FIG. 6 illustrates an example of relative positions or arrangements of some elements (e.g., semiconductor patterns OSP1 and OSP2, control electrodes GE1 and GE2, input electrodes DE1 and DE2, and output electrodes SE1 and SE2) constituting the switching transistor T1 and the driving transistor T2. First, second, third, fourth, and fifth through holes CH1, CH2, CH3, CH4, and CH5 may also be exemplarily illustrated in FIG. 6.

The display element layer DP-OLED may include the light emitting element OLED. In the present example embodiment, the display element layer DP-OLED may include an organic light emitting diode, which is used as the light emitting element OLED. The display element layer DP-OLED may include a pixel definition layer PDL. For example, the pixel definition layer PDL may be an organic layer.

A first electrode AE may be disposed on the third insulating layer 30, and may be connected to the output electrode SE2 through the fifth through hole CH5 penetrating the third insulating layer 30. An opening OP may be defined in the pixel definition layer PDL, and may expose at least a portion of the first electrode AE. In the present example embodiment, a pixel region PXA may be defined to correspond to a region of the first electrode AE exposed by the opening OP. A light-blocking region NPXA may be a region, which is located adjacent to the pixel region PXA and is configured to prevent light from being emitted therefrom.

A hole control layer HCL and an electron control layer ECL may be commonly disposed in the pixel region PXA and the light-blocking region NPXA. Also, the hole control layer HCL and the electron control layer ECL may be commonly disposed in a plurality of pixel regions.

The hole control layer HCL may include a hole transport layer and, in an example embodiment of the present inventive concept, the hole control layer HCL may further include a hole injection layer. A light emitting layer EML may generate a color light corresponding to a pixel. The light emitting layer EML may be provided on the hole control layer HCL and may be interposed between the hole control layer HCL and the electron control layer ECL. The electron control layer ECL may include an electron transport layer, and in an example embodiment of the present inventive concept, the electron control layer ECL may further include an electron injection layer.

A second electrode CE may be provided on the electron control layer ECL, and may be commonly disposed in the plurality of pixel regions. Thus, the second electrode CE may have an area larger than the first electrode AE. A cover layer protecting the second electrode CE may be further disposed on the second electrode CE.

In the present example embodiment, the second display substrate ES may cover the second electrode CE, and may include at least a base substrate (hereinafter, a second base substrate). In the present example embodiment, the second display substrate ES, which is only composed of the second base substrate, is exemplarily illustrated.

The second display substrate ES may define the cell gap GP and may prevent external moisture from entering the light emitting element OLED. The second display substrate ES may be an encapsulation substrate. For example, the combination of the sealing members S-I and S-O, the first display substrate DS and the second display substrate ES may enclose the light emitting element OLED, thereby preventing external moisture from entering the light emitting element OLED.

Figure 7A:
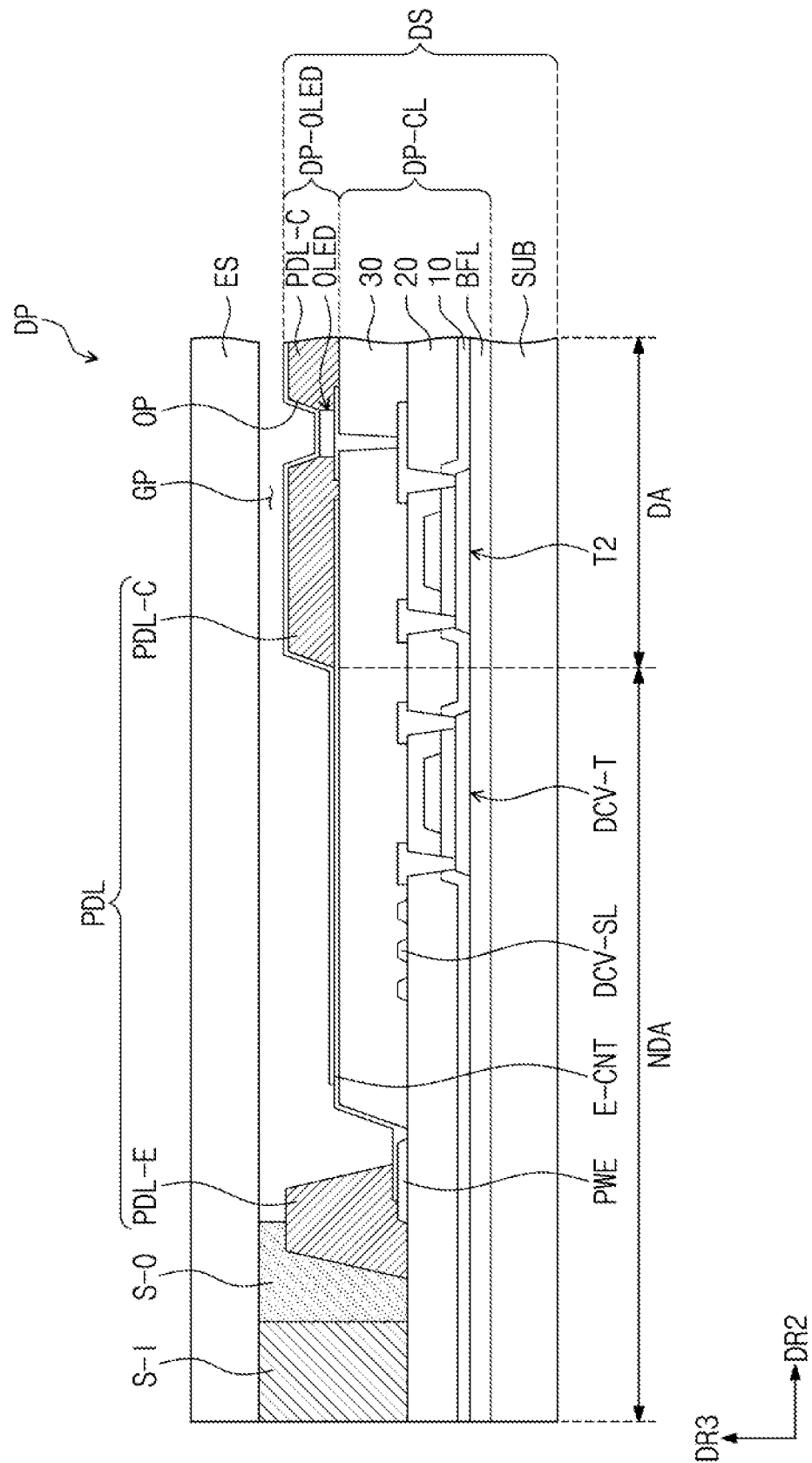
FIG. 7A is an enlarged cross-sectional view illustrating a display panel according to an example embodiment of the present inventive concept.
Figure 7B:
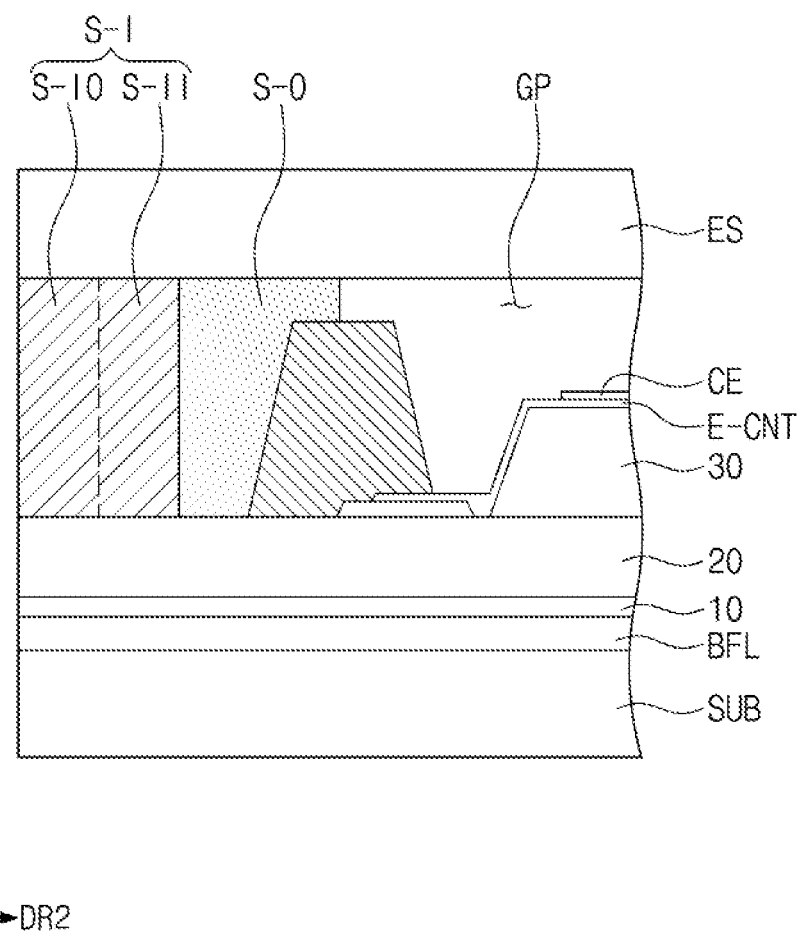
FIG. 7B is an enlarged cross-sectional view illustrating a display panel according to an example embodiment of the present inventive concept.
Figure 7C:
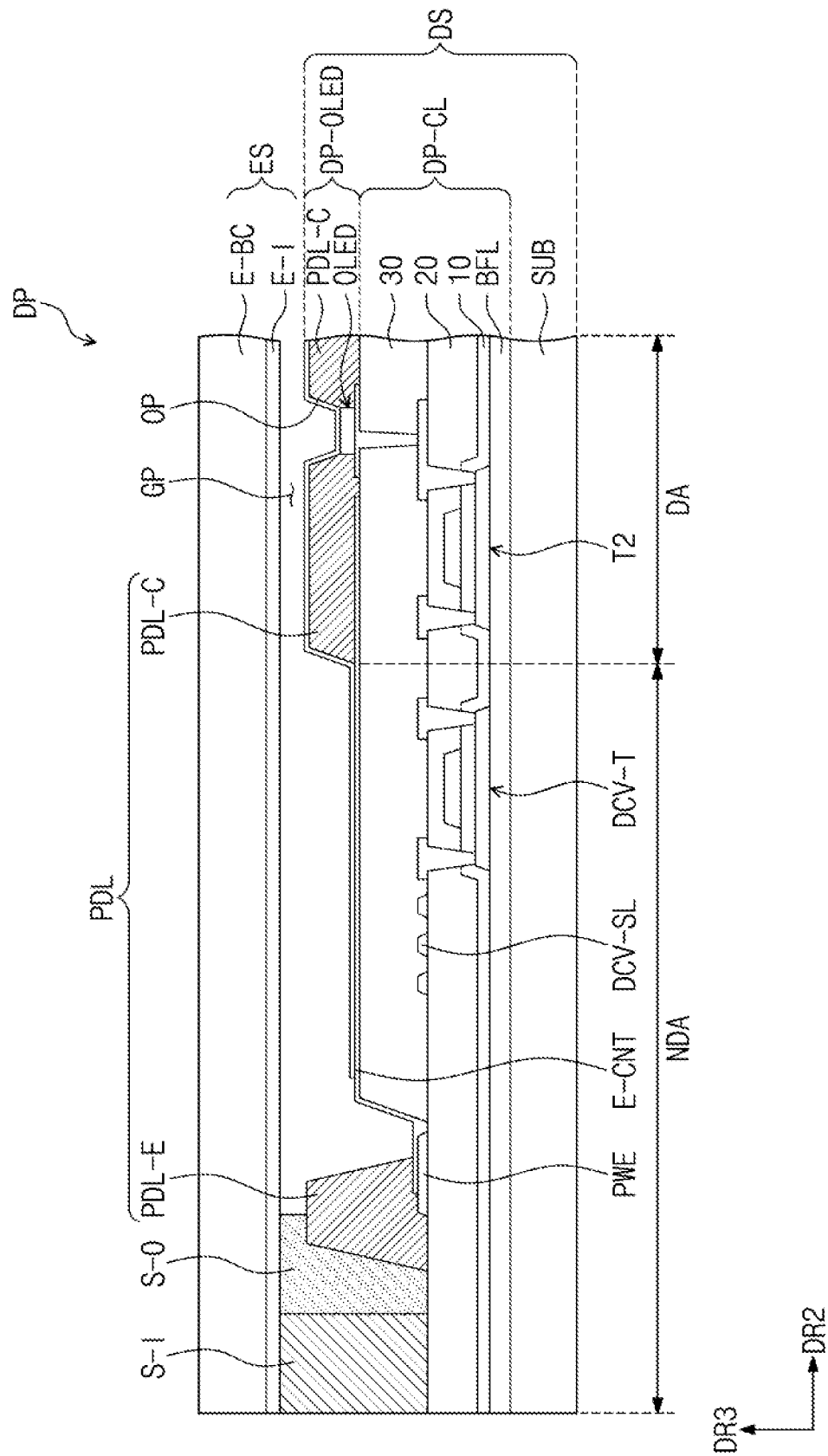
FIG. 7C is an enlarged cross-sectional view illustrating a display panel according to an example embodiment of the present inventive concept.
Figure 7D:
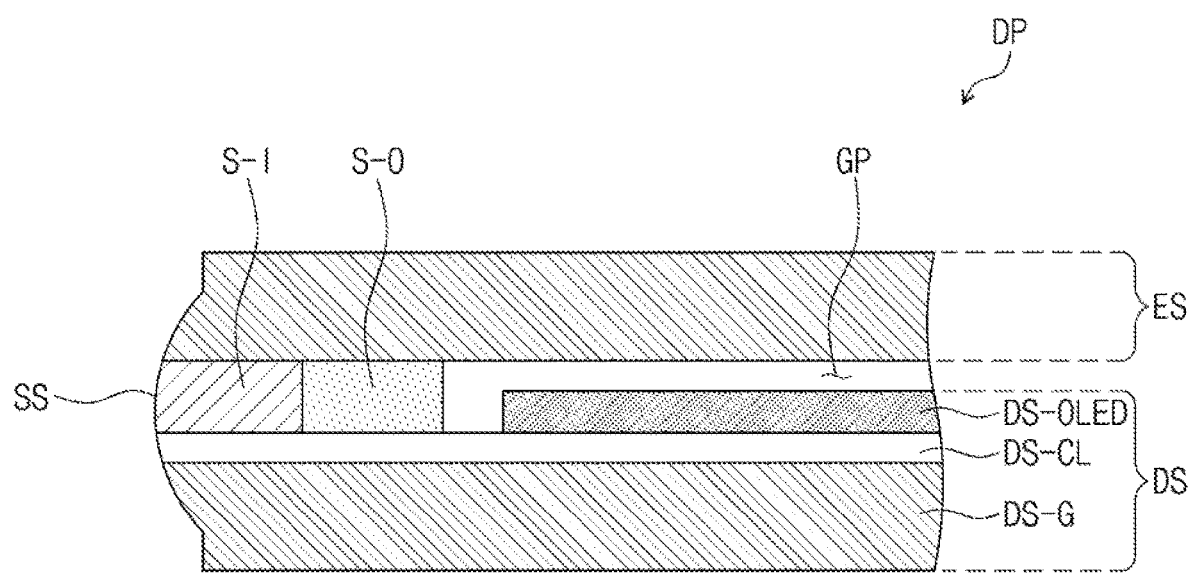
FIG. 7D is an enlarged cross-sectional view illustrating a display panel according to an example embodiment of the present inventive concept.

FIGS. 7A to 7D are enlarged cross-sectional views illustrating the display panel DP according to an example embodiment of the present inventive concept. FIGS. 7A, 7C, and 7D are cross-sectional views taken along line I-I' of FIG. 4. FIGS. 7A and 7C are illustrated at an increased magnification, compared to FIG. 7D. For example, in comparison to FIG. 7D, more detailed components are illustrated in FIGS. 7A and 7C.

In FIG. 7A, the stacking structure of the circuit layer DP-CL and the display element layer DP-OLED disposed in the display region DA may be the same as that of FIG. 6, and thus, a detailed description thereof will be omitted. FIG. 7 illustrates the light emitting element OLED in a simplified manner, compared to FIG. 6.

Referring to FIG. 7A, a transistor DCV-T of the gate driving circuit DCV is illustrated. The transistor DCV-T, which is formed by a process the same as that of the driving transistor T2, is exemplarily illustrated. Furthermore, signal lines DCV-SL, which are disposed on a layer the same as that of electrodes of the driving transistor T2 of the gate driving circuit DCV, are illustrated. In addition, a power electrode PWE providing the second power voltage ELVSS is illustrated.

The power electrode PWE may be disposed outside the gate driving circuit DCV, and may receive the second power voltage ELVSS from the outside. A connection electrode E-CNT may be disposed on the third insulating layer 30, and may connect the power electrode PWE to the second electrode CE. The connection electrode E-CNT may be formed by a process the same as that for the first electrode AE, and in this case, the connection electrode E-CNT may have a stacking structure the same as that of the first electrode AE.

The pixel definition layer PDL may include an edge portion PDL-E overlapped with the non-display region NDA and a center portion PDL-C overlapped with the display region DA. The center portion PDL-C and the edge portion PDL-E may be formed at the same time by the same process. In this case, the center portion PDL-C and the edge portion PDL-E may be formed of or include the same material. However, the present inventive concept is not limited thereto. For example, the edge portion PDL-E may be separately formed independent of the formation of the center portion PDL-C and may be formed of a material different from that of the center portion PDL-C. The pixel definition layer PDL may further include a portion, which is disposed on the third insulating layer 30 and is overlapped with the non-display region NDA.

The openings OP corresponding to the light emitting element OLED may be defined in the center portion PDL-C. The edge portion PDL-E may be disposed on the circuit layer DP-CL, and at least a portion of the edge portion PDL-E may be overlapped with the power electrode PWE.

The edge portion PDL-E may have a closed-line shape, and may include a first region and a second region, when viewed in a plan view. The first region may be spaced apart from the second display substrate ES, as shown in FIG. 7A. The second region may be in contact with the second display substrate ES, and may serve as a spacer. The first region and the second region may be formed using a halftone mask. A region serving as the spacer may be defined in the center portion PDL-C.

The organic sealing member S-O may be disposed between the frit sealing member S-I and the edge portion PDL-E and may be in contact with each of the frit sealing member S-I and the edge portion PDL-E. A portion of the organic sealing member S-O may be disposed between the edge portion PDL-E and the second display substrate ES in the third direction DR3.

In an example embodiment of the present inventive concept, the frit sealing member S-I may include a single region having the same crystallization temperature. In an example embodiment of the present inventive concept, the frit sealing member S-I may include a plurality of regions having different crystallization temperatures.

A crystallization temperature of the frit sealing member S-I may be determined by a chemical composition of the frit sealing member S-I. The frit sealing member S-I containing silver (Ag) may have a crystallization temperature lower than that of a silver-free frit sealing member. For example, the frit sealing member S-I may include silver oxide ($Ag_2O$).

As shown in FIG. 7B, the frit sealing member S-I may include an outer region S-IO and an inner region S-II, whose crystallization temperatures are different from each other. The crystallization temperature of the outer region S-IO may be lower than the crystallization temperature of the inner region S-II by about 5° C. to about 50° C.

A difference in crystallization temperature between the outer region S-IO and the inner region S-II may be determined by a ratio in weight of vanadium (V) to zinc (Zn). The lower the ratio in weight of vanadium (V) to zinc (Zn), the lower the crystallization temperature. In an example embodiment of the present inventive concept, the frit sealing member S-I may include vanadium oxide ($V_2O_5$) and zinc oxide (ZnO), and may optionally include silver oxide ($Ag_2O$).

In the case where the frit sealing member S-I contains silver (Ag), the outer region S-IO of the frit sealing member S-I may have a crystallization temperature ranging from about 290° C. to about 310° C. and the inner region S-II of the frit sealing member S-I may have a crystallization temperature ranging from about 240° C. to about 260° C. By contrast, in the case where the frit sealing member S-I does not contain silver (Ag), the outer region S-IO of the frit sealing member S-I may have a crystallization temperature ranging from about 440° C. to about 460° C. and the inner region S-II of the frit sealing member S-I may have a crystallization temperature ranging from about 390° C. to about 410° C. The crystallization temperature of the frit sealing member S-I may be measured by differential scanning calorimetry (DSC) or differential thermal analysis (DTA).

The inner region S-II may be disposed between the outer region S-IO and the organic sealing member S-O and may serve as a heat blocking partition wall in a fabrication process. This will be described in more detail below.

The inner region S-II may have a crystallization temperature lower than that of the outer region S-IO. The inner region S-II and the outer region S-IO may have different chemical compositions. For example, a ratio in weight of vanadium (V) to zinc (Zn) in the inner region S-II may be lower than a ratio in weight of vanadium (V) to zinc (Zn) in the outer region S-IO.

The inner region S-II, the outer region S-IO, and the organic sealing member S-O may be directly disposed on the second insulating layer 20, which is an inorganic layer. The second insulating layer 20 is in the first display substrate DS. The inner region S-II, the outer region S-IO, and the organic sealing member S-O may be directly coupled to the bottom surface of the base substrate of the second display substrate ES. In other words, the inner region S-II, the outer region S-IO, and the organic sealing member S-O may bond the first display substrate DS and the second display substrate ES.

As shown in FIG. 7C, the second display substrate ES may include a second base substrate E-BC and a buffer layer E-I. The second base substrate E-BC may include a synthetic resin substrate or a glass substrate.

The buffer layer E-I may be directly disposed on a bottom surface of the second base substrate E-BC. The buffer layer E-I overlapped with the display region DA and the non-display region NDA is illustrated as an example, but the present inventive concept is not limited thereto. For example, to increase a bonding strength between the frit and organic sealing members S-I and S-O and the second display substrate ES, the buffer layer E-I may be disposed in at least the non-display region NDA. When the buffer layer E-I is disposed on the entire bottom surface of the second base substrate E-BC, the buffer layer E-I may flatten a surface of second base substrate E-BC and may prevent moisture and oxygen from penetrating into the cell gap GP.

The frit sealing member S-I may be in contact with the buffer layer E-I. For example, the circuit layer DP-CL may include an inorganic layer (e.g., the second insulating layer 20), the second display substrate ES may include a glass substrate (e.g., the second base substrate E-BC) and the buffer layer E-I, which is disposed on a bottom surface of the glass substrate (e.g., the second base substrate E-BC), and the frit sealing member S-I may be in contact with the inorganic layer (e.g., the second insulating layer 20) and the buffer layer E-I. The buffer layer E-I may include an inorganic layer (e.g., a silicon oxynitride (SiON) layer, a silicon oxide ($SiO_2$) layer, or a silicon nitride ($Si_3N_4$) layer). Alternatively, the buffer layer E-I may include a metal layer, a metal oxide layer, and/or a metal nitride layer. For example, the buffer layer E-I may include at least one of silicon nitride ($Si_3N_4$), silicon oxide ($SiO_2$), titanium oxide ($TiO_2$), titanium nitride (TiN), zinc oxide (ZnO). In an example embodiment of the present inventive concept, the buffer layer E-I, the second insulating layer 20, the frit sealing member S-I may all be formed of inorganic materials, and together may prevent moisture and oxygen from penetrating into the cell gap GP.

As shown in FIG. 7D, the display panel DP may have a curved side surface SS, when viewed in a cross-sectional view. In the case where the frit sealing member S-I is partially exposed during the process of fabricating the frit sealing member S-I, there may be a spatial difference in internal stress of the frit sealing member S-I. In the case where an edge portion of the display panel DP is cut using this stress distribution, the side surface SS may have the curved surface.

Figure 8:
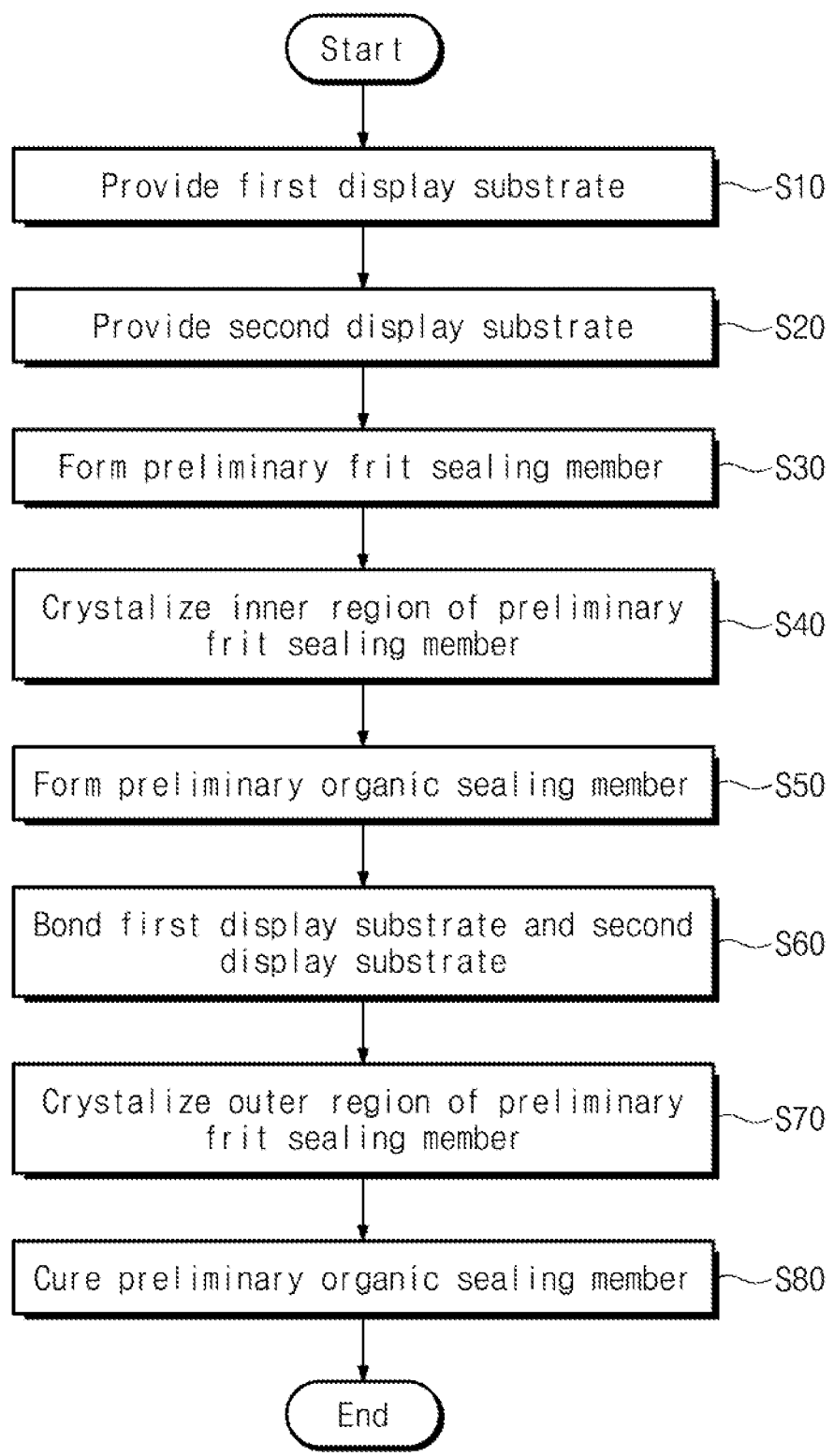
FIG. 8 is a flow chart illustrating a method of fabricating a display panel according to an example embodiment of the present inventive concept.

FIG. 8 is a flow chart exemplarily illustrating a method of fabricating of the display panel DP according to an example embodiment of the present inventive concept. FIGS. 9A to 9F are cross-sectional views exemplarily illustrating a method of fabricating the display panel DP according to an example embodiment of the present inventive concept. The first display substrate DS and the second display substrate ES are simply illustrated in FIGS. 9A to 9F. For concise description, an element previously described with reference to FIGS. 1 to 7D may be identified by the same reference number without repeating an overlapping description thereof.

As shown in FIG. 8, a first display substrate may be provided (S10). The first display substrate may be the lower display substrate DS (i.e., an array substrate) described with reference to FIGS. 1 to 7D. The first display substrate may be fabricated through known fabrication processes.

As shown in FIG. 8, a second display substrate may be provided (S20). The second display substrate may be a glass substrate. The process of fabricating the first display substrate and the second display substrate may not be limited to a specific fabrication order. For example, the step S20 of providing the second display substrate may be before the step S10 of providing the first display substrate. The sequence of the steps as shown in FIG. 8 is preferred. However, the present inventive concept is not limited to the performance of these steps with the sequence or order presented in FIG. 8. Many steps may also be applied to the first display substrate and the second display substrate before, between or after the steps shown in FIG. 8. The first display substrate and the second display substrate may be provided in the form of a working display substrate. This will be described in more detail below.

Next, as shown in FIG. 8, a preliminary frit sealing member may be formed (S30). The preliminary frit sealing member may be formed on a surface of one of the second display substrate and the first display substrate.

As shown in FIG. 9A, a preliminary frit sealing member S-IP may be formed on a surface of the second display substrate ES, and may be formed to be overlapped with the non-display region NDA. When viewed in a plan view, the preliminary frit sealing member S-IP may have a closed-line shape, like the frit sealing member S-I shown in FIG. 3. Thus, like the frit sealing member S-I, the preliminary frit sealing member S-IP may surround the display region DA in a plan view.

A frit paste or frit composite may be printed on the surface of the second display substrate ES. The frit paste may include frit powder, organic binder, and organic solvent. The frit powder may refer to a particle-shaped base glass. The frit paste may further include a ceramic filler. The organic solvent may be removed by drying the printed frit paste. In the drying step, a portion of the organic binder may be removed.

Thereafter, a sintering step may be performed by providing heat to the frit paste, from which the organic solvent is removed. The organic binder may be removed by the sintering step. A process temperature of the sintering step may range from a glass transition temperature of the frit powder to a crystallization temperature of the frit powder. Thus, in the sintering step, the organic solvent and the organic binder may be removed, but the preliminary frit sealing member S-IP may not be crystalized.

Next, as shown in FIG. 8, an inner region of the preliminary frit sealing member may be crystalized (S40). A portion of the frit paste, on which the sintering step has been performed, may be crystalized.

As shown in FIG. 9B, a region of the preliminary frit sealing member S-IP may be irradiated with a laser beam to crystalize the region of the preliminary frit sealing member S-IP, on which the sintering step has been performed. The region, which is crystalized by a laser source LS, may be defined as the inner region S-II. Hereinafter, a region S-IOP, which is not irradiated by the laser beam, will be referred to as a preliminary outer region. The frit powder of the inner region S-II may be melted by the laser beam, and the melted frit may be cooled and crystalized. For example, the frit powder of the inner region S-II may be heated up to a temperature higher than the crystallization temperature of the frit powder of the inner region S-II by the laser beam. The preliminary outer region S-IOP may be a frit paste, which is in a dried and sintered state.

Next, as shown in FIG. 8, a preliminary organic sealing member may be formed (S50). The preliminary organic sealing member may be formed on a surface of one of the first display substrate and the second display substrate.

Figure 9C:
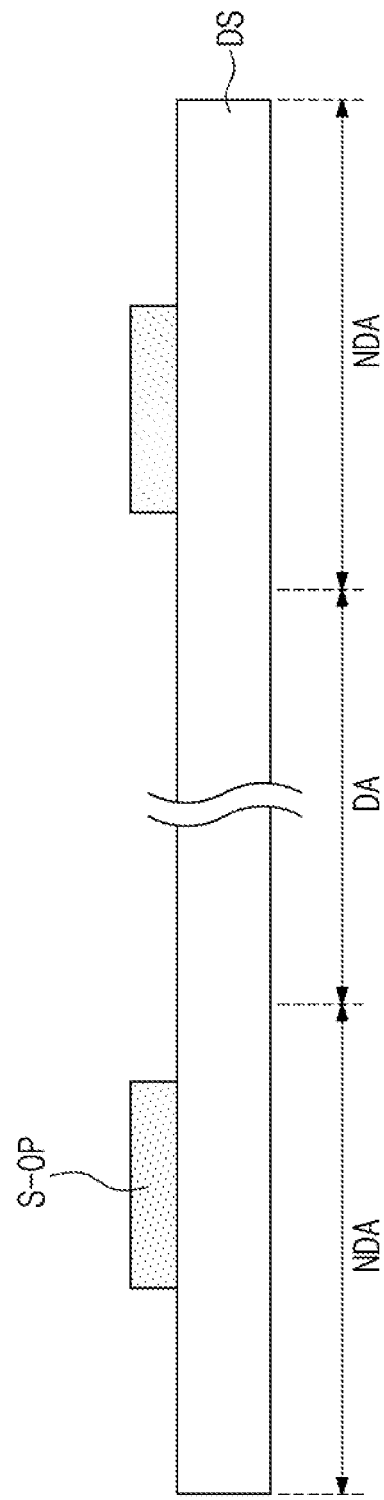

As shown in FIG. 9C, the preliminary organic sealing member S-OP may be formed on a surface of the first display substrate DS. As shown in FIG. 7A, the preliminary organic sealing member S-OP may be formed on the second insulating layer 20.

When viewed in a plan view, the preliminary organic sealing member S-OP may have a closed-line shape, and may be formed to be overlapped with the non-display region NDA, like the organic sealing member S-O shown in FIG. 3. An organic composite may be printed on a surface of the first display substrate DS. The organic composite may include a base resin (e.g., epoxy resin) and an organic solvent.

Next, as shown in FIGS. 8 and 9D, the first display substrate DS and the second display substrate ES may be bonded to each other (S60). The preliminary frit sealing member S-IP and the preliminary organic sealing member S-OP may be aligned to be disposed between the first display substrate DS and the second display substrate ES and then the first display substrate DS and the second display substrate ES may be bonded or combined to each other.

Referring to FIG. 9D, although an inner edge of the preliminary frit sealing member S-IP is illustrated to be exactly aligned to an outer edge of the preliminary organic sealing member S-OP, but the present inventive concept is not limited thereto. For example, to allow the preliminary frit sealing member S-IP to be in contact with the preliminary organic sealing member S-OP after the bonding process, the preliminary frit sealing member S-IP and the preliminary organic sealing member S-OP may be aligned to be overlapped with each other in a specific overlap width. Thus, the first display substrate DS and the second display substrate ES may be bonded in such a way that the preliminary frit sealing member S-IP and the preliminary organic sealing member S-OP are disposed between the first display substrate DS and the second display substrate ES in a cross-sectional view, and the preliminary organic sealing member S-OP is disposed next to an inner side of the preliminary frit sealing member S-IP in a plan view. Here, the inner side is the side near the center of the first display substrate DS and the second display substrate ES. For example, like the frit sealing member S-I and the organic sealing member S-O shown in FIG. 3, when viewed in a plan view, the preliminary organic sealing member S-OP may be surrounded by the preliminary frit sealing member S-IP. Also, in the bonding of the first display substrate DS and the second display substrate ES, the inner region S-II of the preliminary frit sealing member S-IP may be in contact with the preliminary organic sealing member S-OP.

Thereafter, as shown in FIGS. 8 and 9E, the preliminary outer region S-IOP may be crystalized (S70). The laser source LS may be used to irradiate the preliminary outer region S-IOP with a laser beam. For example, the preliminary outer region S-IOP may be heated up to a temperature higher than the crystallization temperature of the preliminary outer region S-IOP by the laser beam.

The inner region S-II, which has a previously crystallized structure, may serve as a heat blocking partition wall, in a step of crystalizing the preliminary outer region S-IOP. The inner region S-II may block heat, which is provided to the preliminary outer region S-IOP, and may prevent the preliminary organic sealing member S-OP from being damaged by the heat. Thus, an outgassing issue may be prevented from occurring in the preliminary organic sealing member S-OP.

In an example embodiment of the present inventive concept, the laser source LS may crystalize the preliminary outer region S-IOP and attach the first display substrate DS and the second display substrate ES by irradiating the laser beam through the second display substrate ES on the preliminary outer region S-IOP between the first display substrate DS and the second display substrate ES. In this case, the preliminary outer region S-IOP may be melted by the laser beam, and the melted preliminary outer region S-IOP may be cooled and crystalized.

As shown in FIG. 9F, as a result of the crystallization of the preliminary outer region S-IOP, the frit sealing member S-I, in which a boundary between an outer region and an inner region is absent, may be formed.

Next, as shown in FIG. 8, the preliminary organic sealing member may be cured (S80). A heat curing or light curing process may be performed. As shown in FIGS. 9E and 9F, in the present example embodiment, the curing of the preliminary organic sealing member S-OP may be performed after the crystallization of the preliminary outer region S-IOP. However, the present inventive concept is not limited thereto. For example, in an example embodiment of the present inventive concept, the curing of the preliminary organic sealing member S-OP and the crystallization of the preliminary outer region S-IOP may be performed in a reversed order.

Figure 10:
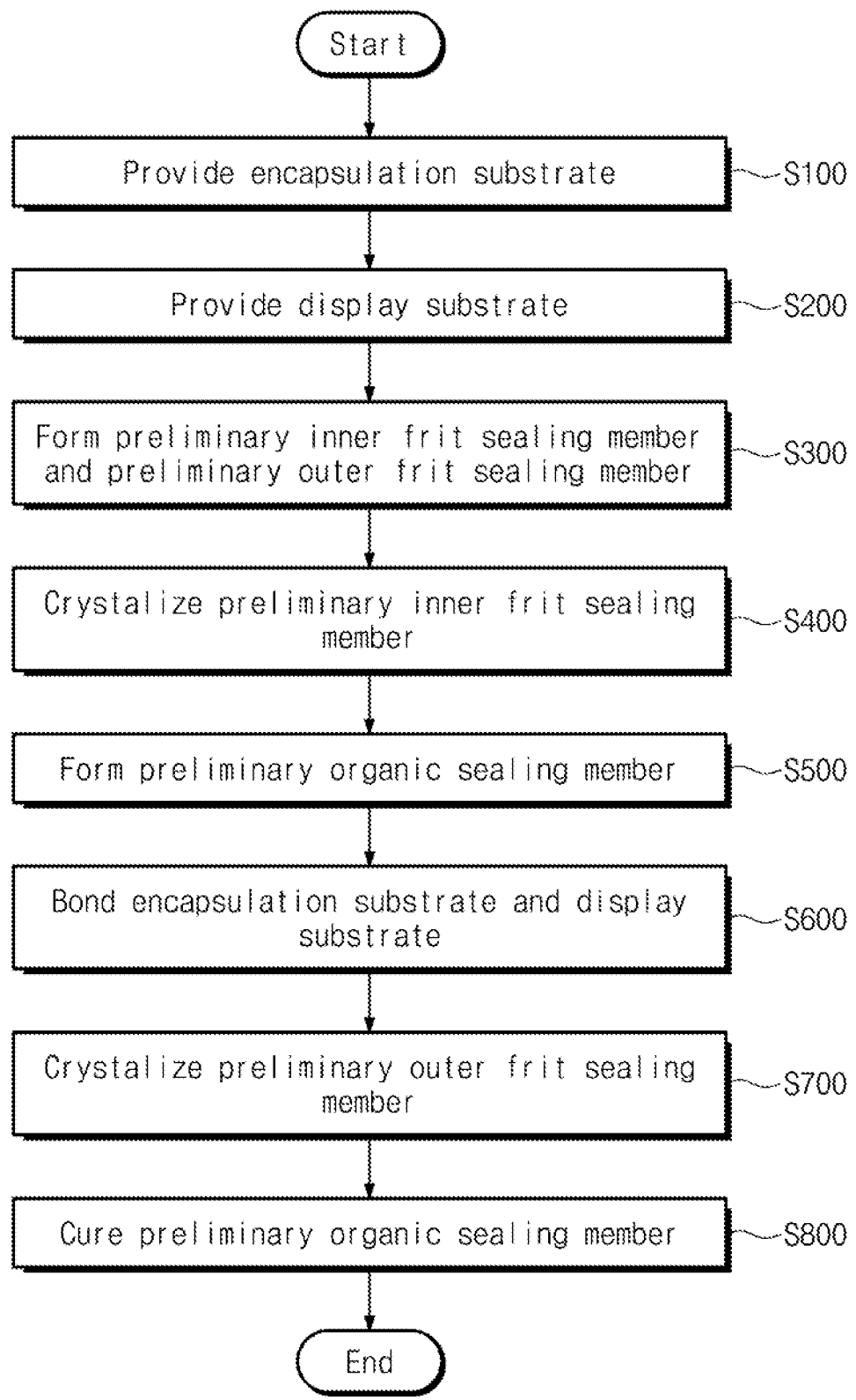
FIG. 10 is a flow chart illustrating a method of fabricating a display panel according to an example embodiment of the present inventive concept.

FIG. 10 is a flow chart illustrating a method of fabricating the display panel DP according to an example embodiment of the present inventive concept. FIGS. 11A to 11F are cross-sectional views illustrating a method of fabricating the display panel DP according to an example embodiment of the present inventive concept. Different features from the fabrication method of FIGS. 8 to 9F will be described below.

As shown in FIG. 10, an encapsulation substrate (i.e., second display substrate) may be provided (S100). In addition, a display substrate (i.e., first display substrate) may be provided (S200). The step S200 of providing the first display substrate may be before the step S100 of providing the second display substrate. The sequence of the steps as shown in FIG. 10 is preferred. However, the present inventive concept is not limited to the performance of these steps with the sequence or order presented in FIG. 10. Many steps may also be applied to the first display substrate and the second display substrate before, between or after the steps shown in FIG. 10.

Next, as shown in FIG. 10, a preliminary inner frit sealing member or a first preliminary frit sealing member and a preliminary outer frit sealing member or a second preliminary frit sealing member may be formed (S300). For example, the second preliminary frit sealing member may be disposed next to an outer side of the first preliminary frit sealing member. In the present example embodiment, the preliminary inner frit sealing member and the preliminary outer frit sealing member may be formed simultaneously.

As shown in FIG. 11A, a first frit paste for forming a preliminary inner frit sealing member S-IP1 and a second frit paste for forming a preliminary outer frit sealing member S-IP2 may be printed on a surface of the second display substrate ES. The first frit paste and the second frit paste may include frit powder, organic binder, and organic solvent. The first frit paste and the second frit paste may have chemical compositions different from each other.

The organic solvent may be removed by drying the printed first and second frit pastes. The dried first frit paste and the dried second frit paste may be in contact with each other. Thus, the first preliminary frit sealing member (the preliminary inner frit sealing member S-IP1) formed by the first frit paste and the second preliminary frit sealing member (the preliminary outer frit sealing member S-IP2) formed by the second frit paste may be in contact with each other. The present inventive concept is not limited to a specific method of forming the preliminary inner frit sealing member S-IP1 and the preliminary outer frit sealing member S-IP2. For example, two combined dispensers or a silk-screen printing method may be used to form the preliminary inner frit sealing member S-IP1 and the preliminary outer frit sealing member S-IP2.

The chemical compositions of the first and second frit pastes may be adjusted to control crystallization temperatures of the preliminary inner frit sealing member S-IP1 and the preliminary outer frit sealing member S-IP2. The first frit paste may have a frit powder, of which a ratio in weight of vanadium (V) to zinc (Zn) is lower than that in the second frit paste, and in this case, the preliminary inner frit sealing member S-IP1 may have a crystallization temperature lower, by about 5° C. to about 50° C., than that of the preliminary outer frit sealing member S-IP2. In other words, a weight percentage (wt %) of vanadium (V) contained in the first frit paste may be lower than that in the second frit paste. In this case, the chemical compositions of the first and second frit pastes may be adjusted, such that the crystallization temperature of the preliminary inner frit sealing member S-IP1 is lower than the crystallization temperature of the preliminary outer frit sealing member S-IP2.

In an example embodiment of the present inventive concept, the preliminary inner frit sealing member S-IP1 and the preliminary outer frit sealing member S-IP2 may be sequentially formed on a surface of the second display substrate ES. In an example embodiment of the present inventive concept, one of the preliminary inner frit sealing member S-IP1 and the preliminary outer frit sealing member S-IP2 may be formed on a surface of the second display substrate ES, and the other may be formed on a surface of the first display substrate DS. However, to prevent the circuit layer DP-CL and the display element layer DP-OLED from being damaged, the preliminary frit sealing members S-IP1 and S-IP2 may be preferably formed on a surface of the second display substrate ES.

Next, as shown in FIG. 10, the preliminary inner frit sealing member S-IP1 may be crystalized (S400). In the present example embodiment, only the preliminary inner frit sealing member S-IP1 may be selectively crystalized, even when the preliminary inner frit sealing member S-IP1 and the preliminary outer frit sealing member S-IP2 are heated to the same temperature. For example, the crystalizing of the first preliminary frit sealing member (the preliminary inner frit sealing member S-IP1) may include heating the first preliminary frit sealing member (the preliminary inner frit sealing member S-IP1) and the second preliminary frit sealing member (the preliminary outer frit sealing member S-IP2).

Figure 11B:
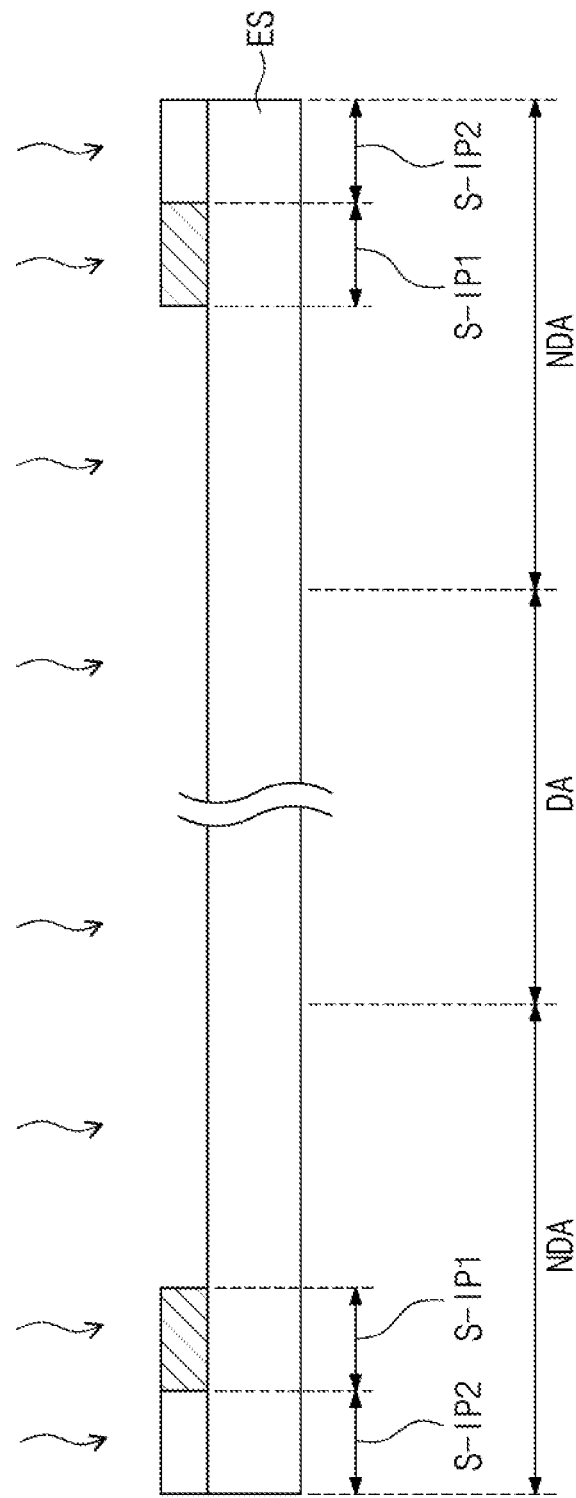

As shown in FIG. 11B, the preliminary inner frit sealing member S-IP1 and the preliminary outer frit sealing member S-IP2 may be heated to a specific temperature. The specific temperature may range from the crystallization temperature of the frit powder of the preliminary inner frit sealing member S-IP1 to the crystallization temperature of the frit powder of the preliminary outer frit sealing member S-IP2. Since the specific temperature is below the crystallization temperature of the frit powder of the preliminary outer frit sealing member S-IP2, the preliminary outer frit sealing member S-IP2 may not be crystalized at the specific temperature.

Radiant heat may be provided to the preliminary inner frit sealing member S-IP1 and the preliminary outer frit sealing member S-IP2, and only the preliminary inner frit sealing member S-IP1, which is heated to a temperature higher than its crystallization temperature, may be selectively crystalized. In the case where the crystallization temperature of the preliminary inner frit sealing member S-IP1 ranges from about 240° C. to about 260° C. and the crystallization temperature of the preliminary outer frit sealing member S-IP2 ranges from about 290° C. to about 310° C., the preliminary inner frit sealing member S-IP1 and the preliminary outer frit sealing member S-IP2 may be heated to a temperature from about 250° C. to about 280° C. In the case where the crystallization temperature of the preliminary inner frit sealing member S-IP1 ranges from about 390° C. to about 410° C. and the crystallization temperature of the preliminary outer frit sealing member S-IP2 ranges from about 440° C. to about 460° C., the preliminary inner frit sealing member S-IP1 and the preliminary outer frit sealing member S-IP2 may be heated to a temperature from about 400° C. to about 430° C. The crystallization temperatures of the preliminary inner frit sealing member S-IP1 and the preliminary outer frit sealing member S-IP2 may be measured by differential scanning calorimetry (DSC) or differential thermal analysis (DTA).

Thereafter, as shown in FIG. 10, a preliminary organic sealing member may be formed (S500). The preliminary organic sealing member may be formed on a surface of one of the first display substrate and the second display substrate. As shown in FIG. 11C, the preliminary organic sealing member S-OP may be formed on a surface of the first display substrate DS.

Next, as shown in FIGS. 10 and 11D, the first display substrate DS and the second display substrate ES (encapsulation substrate) may be bonded to each other (S600).

Figure 11E:
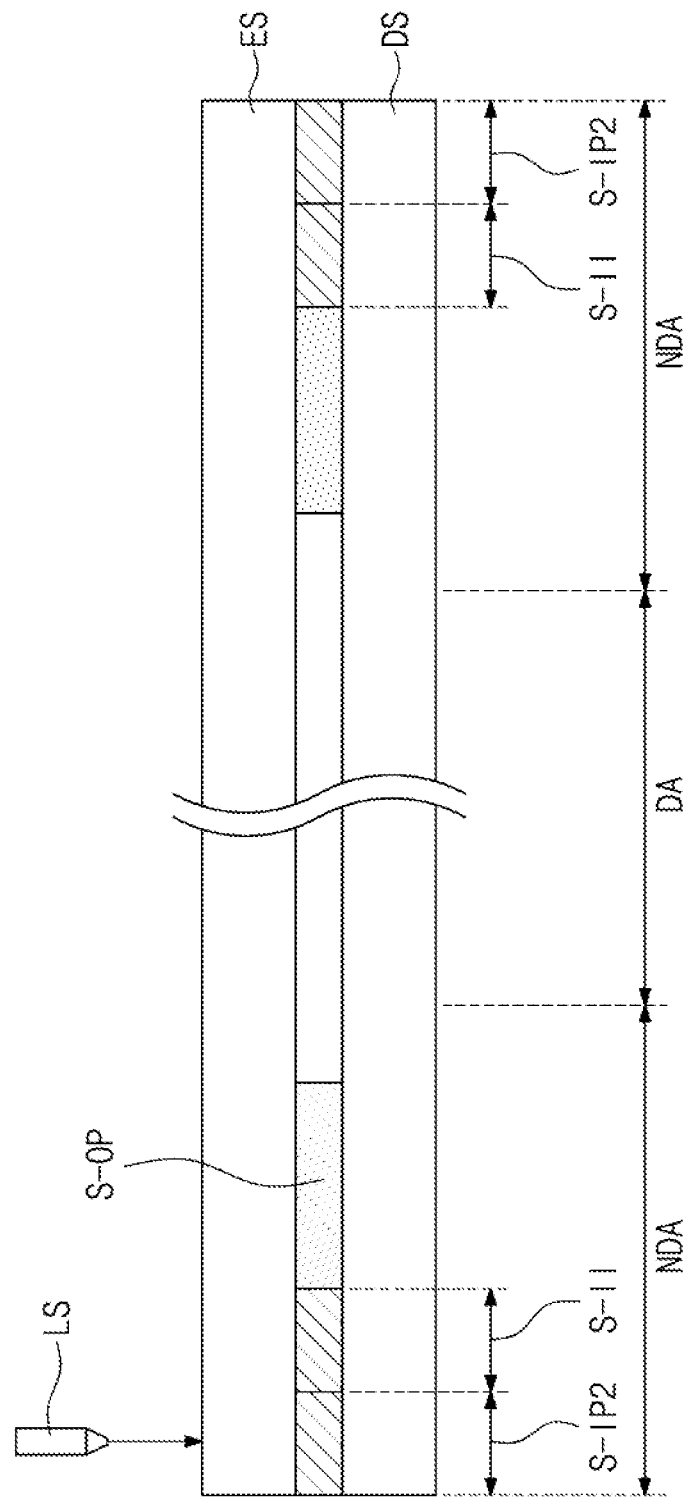

Thereafter, as shown in FIGS. 10 and 11E, the preliminary outer frit sealing member S-IP2 may be crystalized (S700). The laser source LS may be used to irradiate the preliminary outer frit sealing member S-IP2 with a laser beam. For example, the crystalizing of the second preliminary frit sealing member (the preliminary outer frit sealing member S-IP2) may include irradiating the second preliminary frit sealing member (the preliminary outer frit sealing member S-IP2) with a laser beam.

Figure 11F:
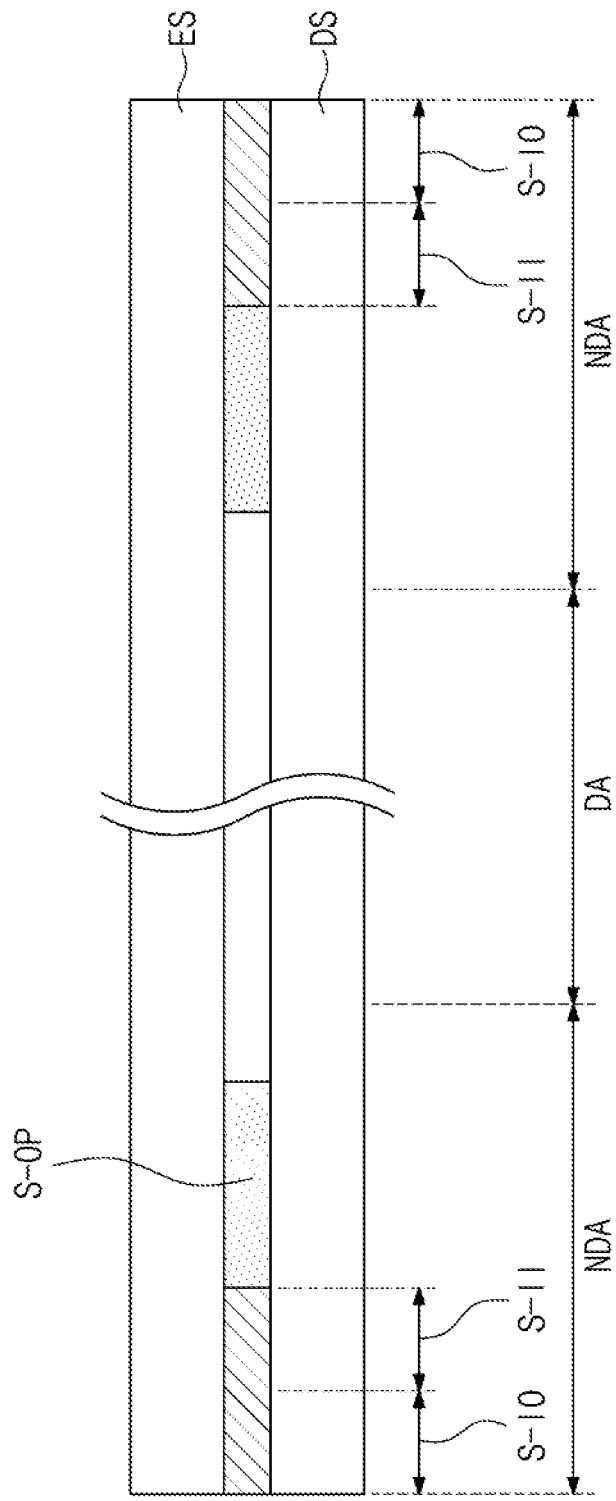

As shown in FIG. 11F, as the preliminary outer frit sealing member S-IP2 is crystallized, the outer frit sealing member S-IO continuously extended from the inner frit sealing member S-II may be formed. The outer frit sealing member S-IO and the inner frit sealing member S-II may constitute a single frit sealing member.

Thereafter, as shown in FIG. 10, the preliminary organic sealing member may be cured (S800). A heat curing or light curing process may be performed. In an example embodiment of the present inventive concept, the preliminary organic sealing member S-OP may include epoxy resin, and the epoxy resin may be irradiated by ultraviolet rays and cured to bond the first display substrate DS and the second display substrate ES. As shown in FIGS. 11E and 11F, in the present example embodiment, after the crystallization of the preliminary outer frit sealing member S-IP2, the preliminary organic sealing member S-OP may be cured. However, the present inventive concept is not limited thereto. For example, in an example embodiment of the present inventive concept, the curing of the preliminary organic sealing member S-OP and the crystallization of the preliminary outer frit sealing member S-IP2 may be performed in a reversed order.

Referring to FIGS. 3, 7A and 11F, in an example embodiment of the present inventive concept, the frit sealing member S-I and the organic sealing member S-O may be interposed between the first display substrate DS and the second display substrate ES, overlapped with the non-display region NDA, surrounding the display elements, and bonding the first display substrate DS and the second display substrate ES. The organic sealing member S-O may be closer to the display elements than the frit sealing member S-I, and may be surrounded by the frit sealing member S-I. The frit sealing member S-I may include the outer frit sealing member S-IO which is at or close to edges of the first and second display substrates DS and ES, and the inner frit sealing member S-II which is disposed next to an inner side of the outer frit sealing member S-IO and next to an outer side of the organic sealing member S-O.

Figure 12A:
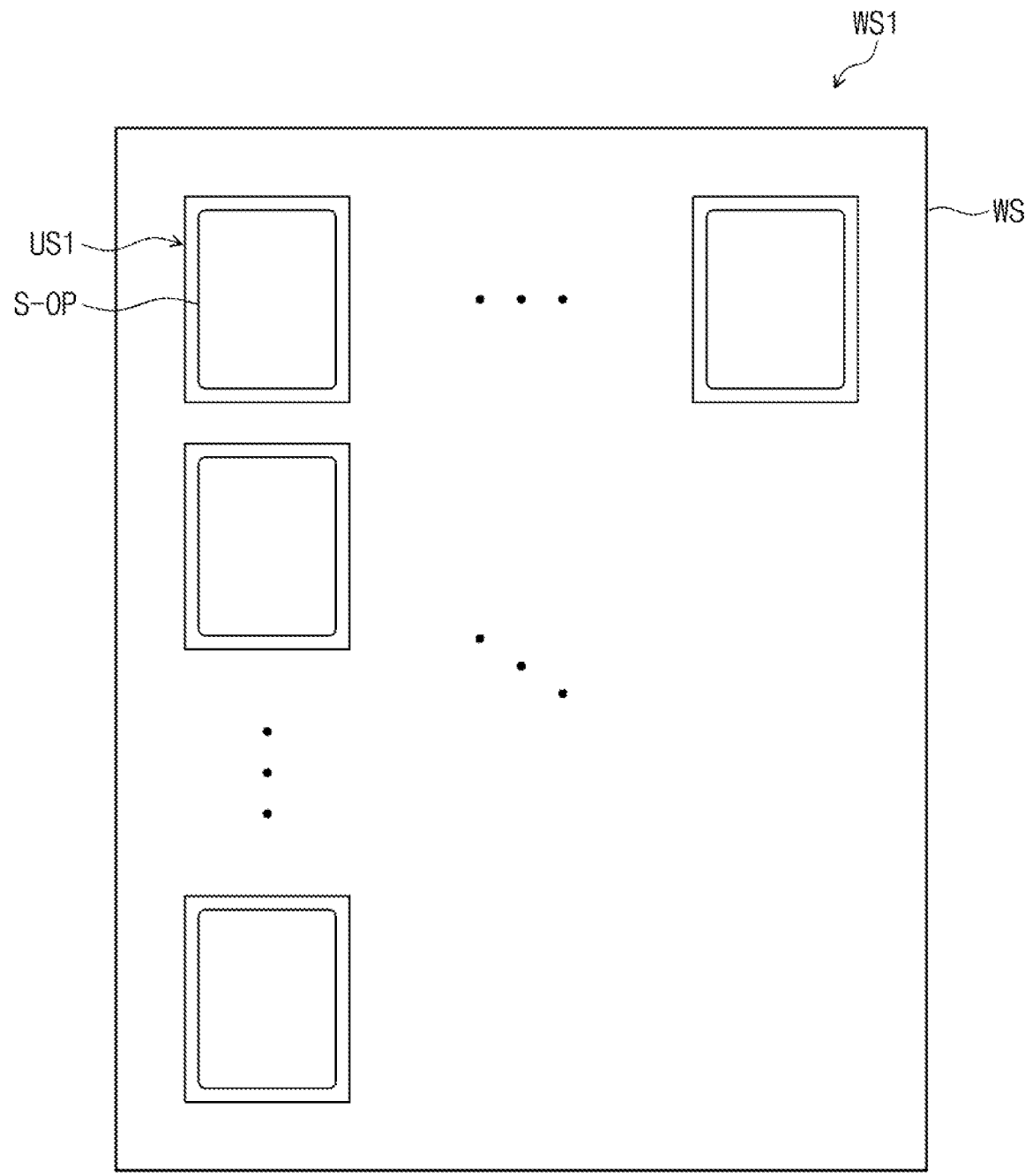
FIG. 12A is a plan view illustrating a first working substrate, which is used for a method of fabricating a display panel, according to an example embodiment of the present inventive concept.
Figure 12B:
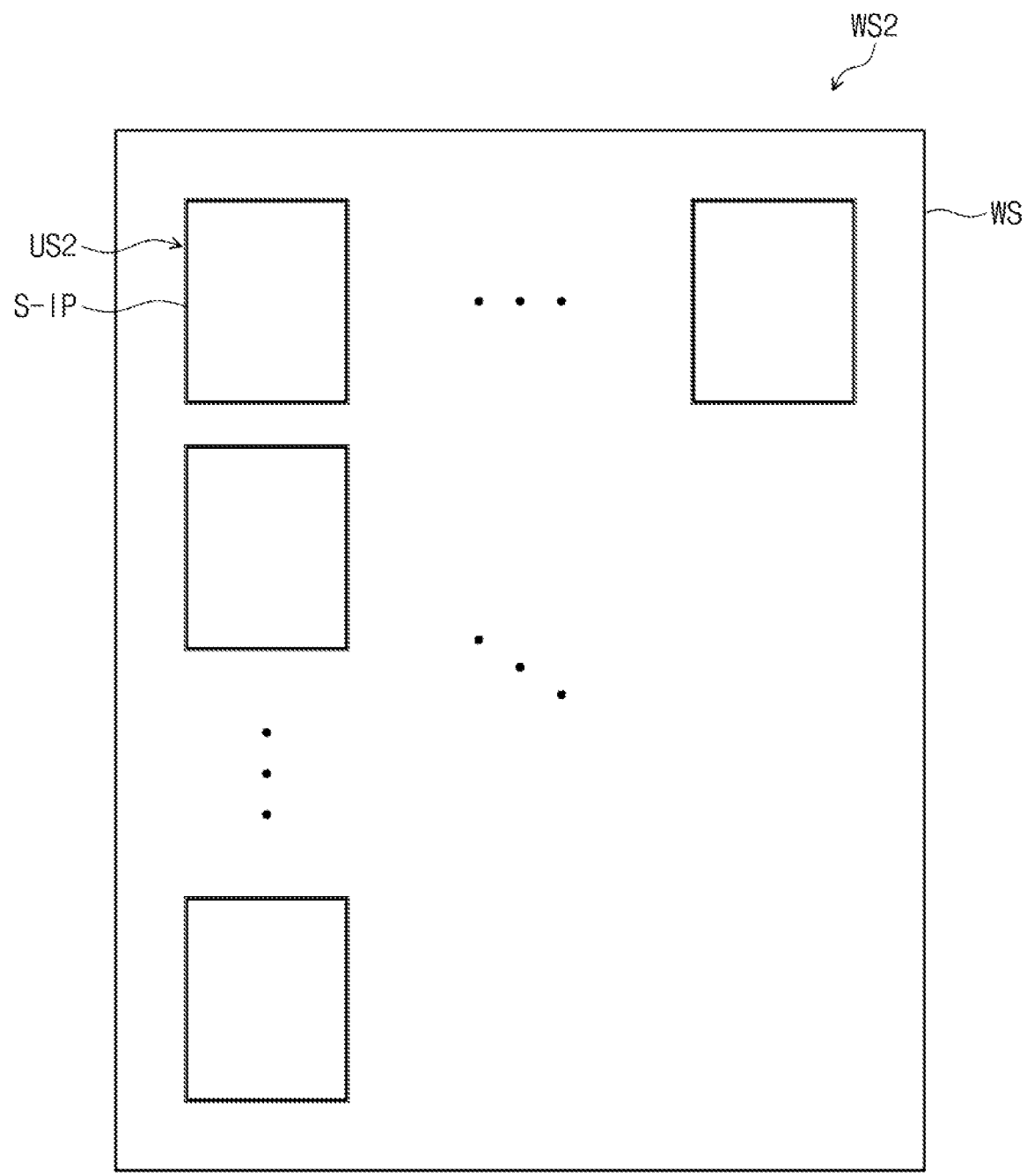
FIG. 12B is a plan view illustrating a second working substrate, which is used for a method of fabricating a display panel, according to an example embodiment of the present inventive concept.

FIG. 12A is a plan view illustrating a first working substrate WS1, which is used for a process of fabricating the display panel DP, according to an example embodiment of the present inventive concept. FIG. 12B is a plan view illustrating a second working substrate WS2, which is used for a process of fabricating the display panel DP, according to an example embodiment of the present inventive concept.

Each of first cell regions US1 shown in FIG. 12A may correspond to one of the first display substrates DS described with reference to FIGS. 1 to 11F. The same process may be performed on each of the first cell regions US1 to form the circuit layer DP-CL and the display element layer DP-OLED in each of the first cell regions US1.

The preliminary organic sealing members S-OP, each of which is formed in a corresponding one of the first cell regions US1, are illustrated in FIG. 12A. This may correspond to the step described with reference to FIG. 9C.

Each of second cell regions US2 shown in FIG. 12B may correspond to one of the second display substrates ES described with reference to FIGS. 1 to 11F. The preliminary frit sealing members S-IP, each of which is formed in a corresponding one of the second cell regions US2, are illustrated in FIG. 12B. This may correspond to the step described with reference to FIG. 9B.

The step of FIG. 9D may be performed by bonding the first working substrate WS1 and the second working substrate WS2 to each other. The steps of FIGS. 9E and 9F may be performed on each of the cell regions of a working panel. The preliminary organic sealing members S-OP may be cured, and the entire preliminary frit sealing members S-IP may be crystalized. Here, the working panel may refer to the first working substrate WS1 and the second working substrate WS2, which are bonded to each other. Next, display panels may be formed by dividing the cell regions of the working panel.

The process of fabricating a display panel, which has been described with reference to FIGS. 10 to 11F, may also be performed using the first working substrate WS1 and the second working substrate WS2.

Since, as described above, an inner region of a frit sealing member is crystalized in advance, the inner region may serve as a heat blocking partition wall, in a step of crystalizing an outer region. Thus, an organic sealing member may be protected from heat, which is provided for the step of crystalizing the outer region, and thereby to prevent the organic sealing member from being thermally damaged. Furthermore, an outgassing issue may be prevented from occurring in the organic sealing member.

In addition, since a display panel includes two types of frit sealing members, the organic sealing member may be prevented from being damaged in a fabrication process. Since an inner region of the frit sealing member is crystalized by a sintering process, it is easy to control the inner region serving as a heat blocking partition wall. Thus, the organic sealing member may be prevented from being thermally damaged and an outgassing issue may be prevented from occurring in the organic sealing member. The frit sealing member may prevent oxygen and/or moisture from entering centers of the cell regions, and may enhance a bonding strength between the first cell regions US1 and the second cell regions US2 of the first working substrate WS1 and the second working substrate WS2, respectively. The organic sealing member may prevent crack formation and crack propagation from occurring in a portion or portions of the first cell regions US1 and the second cell regions US2.

While example embodiments of the present inventive concept have been particularly shown and described, it will be understood by one of ordinary skill in the art that variations in form and detail may be made therein without departing from the spirit and scope of the present inventive concept as defined by the appended claims.

What is claimed is:

1. A method of fabricating a display panel comprising:
providing a first display substrate and a second display substrate, at least one of the first display substrate and the second display substrate including a display region provided with a pixel and a non-display region adjacent to the display region;
forming a first preliminary frit sealing member on a surface of one of the first display substrate and the second display substrate;
forming a second preliminary frit sealing member on a surface of one of the first display substrate and the second display substrate to be disposed next to an outer side of the first preliminary frit sealing member in a plan view;
crystalizing the first preliminary frit sealing member;
forming a preliminary organic sealing member on a surface of one of the second display substrate and the first display substrate;

bonding the first display substrate and the second display substrate such that the first preliminary frit sealing member, the second preliminary frit sealing member, and the preliminary organic sealing member are disposed between the first display substrate and the second display substrate in a cross-sectional view and are overlapped with the non-display region in the plan view and that the preliminary organic sealing member is disposed next to an inner side of the first preliminary frit sealing member in the plan view;

crystalizing the second preliminary frit sealing member; and curing the organic sealing member.

2. The method of claim 1, wherein a ratio in weight of vanadium (V) to zinc (Zn) in the first preliminary frit sealing member is lower than a ratio in weight of vanadium (V) to zinc (Zn) in the second preliminary frit sealing member.

3. The method of claim 1, wherein the first preliminary frit sealing member and the second preliminary frit sealing member are simultaneously formed on a surface of the second display substrate.

4. The method of claim 1, wherein the first preliminary frit sealing member and the second preliminary frit sealing member are in contact with each other.

5. The method of claim 1, wherein the crystalizing of the first preliminary frit sealing member comprises heating the first preliminary frit sealing member and the second preliminary frit sealing member.

6. The method of claim 5, wherein a crystallization temperature of the first preliminary frit sealing member is lower than a crystallization temperature of the second preliminary frit sealing member by about 5° C. to about 50° C.

7. The method of claim 5, wherein a crystallization temperature of the first preliminary frit sealing member ranges from about 240° C. to about 260° C., and a crystallization temperature of the second preliminary frit sealing member ranges from about 290° C. to about 310° C.

8. The method of claim 7, wherein, in the heating of the first preliminary frit sealing member and the second preliminary frit sealing member, the first preliminary frit sealing member and the second preliminary frit sealing member are heated to a temperature in a range from about 250° C. to about 280° C.

9. The method of claim 5, wherein a crystallization temperature of the first preliminary frit sealing member ranges from about 390° C. to about 410° C., and a crystallization temperature of the second preliminary frit sealing member ranges from about 440° C. to about 460° C.

10. The method of claim 9, wherein, in the heating of the first preliminary frit sealing member and the second preliminary frit sealing member, the first preliminary frit sealing member and the second preliminary frit sealing member are heated to a temperature in a range from about 400° C. to about 430° C.

11. The method of claim 1, wherein the crystalizing of the second preliminary frit sealing member comprises irradiating the second preliminary frit sealing member with a laser beam.

* * * * *